(12) United States Patent
Jones et al.

(10) Patent No.: US 10,803,214 B1
(45) Date of Patent: Oct. 13, 2020

(54) TOOL FOR DESIGN AND ANALYSIS OF GROUPED SUPERSATURATED DESIGNS

(71) Applicant: SAS Institute Inc., Cary, NC (US)

(72) Inventors: Bradley Allen Jones, Cary, NC (US); Ryan Adam Lekivetz, Cary, NC (US); Joseph Albert Morgan, Raleigh, NC (US); Caleb Bridges King, Cary, NC (US)

(73) Assignee: SAS Institute Inc., Cary, NC (US)

( * ) Notice: Subject to any disclaimer, the term of this patent is extended or adjusted under 35 U.S.C. 154(b) by 0 days.

(21) Appl. No.: 16/719,200

(22) Filed: Dec. 18, 2019

Related U.S. Application Data

(60) Provisional application No. 62/861,563, filed on Jun. 14, 2019.

(51) Int. Cl.
*G06F 30/20* (2020.01)

(52) U.S. Cl.
CPC .................. *G06F 30/20* (2020.01)

(58) Field of Classification Search
CPC ........................................ G06F 30/20
See application file for complete search history.

(56) References Cited

U.S. PATENT DOCUMENTS

| | | | | |
|---|---|---|---|---|
| 6,615,163 | B1 * | 9/2003 | Rasoulian | G06F 30/00 702/196 |
| 7,610,257 | B1 * | 10/2009 | Abrahams | G06Q 20/10 705/38 |
| 8,280,805 | B1 * | 10/2012 | Abrahams | G06Q 40/025 705/35 |
| 10,338,993 | B1 * | 7/2019 | Lekivetz | G06F 11/3664 |
| 10,386,271 | B1 * | 8/2019 | King | G06F 3/0484 |
| 10,503,846 | B2 * | 12/2019 | Lekivetz | G06N 20/00 |
| 10,535,422 | B2 * | 1/2020 | Lekivetz | G06F 16/90 |
| 2004/0032258 | A1 * | 2/2004 | Blumich | G01V 3/32 324/303 |
| 2018/0060466 | A1 * | 3/2018 | Morgan | G06F 30/20 |

(Continued)

OTHER PUBLICATIONS

Butler, Neil A. "Two-level supersaturated designs for 2k runs and other cases." Journal of Statistical Planning and Inference 139, No. 1 (2009): 23-29. (Year: 2009).*

(Continued)

*Primary Examiner* — Rehana Perveen
*Assistant Examiner* — Chuen-Meei Gan
(74) *Attorney, Agent, or Firm* — Coats & Bennett PLLC

(57) ABSTRACT

A computing device receives a request for a design of an experiment. The design comprises test cases with test conditions for testing factors for the experiment. The device receives a value for a parameter of multiple parameters for the design. The multiple parameters indicate a total number of test cases for the design, a total number of factors for the design, and a total number of groups for grouping factors. The device generates a value for each of one or more other parameters of the multiple parameters such that the design is a supersaturated design. The device generates, based on the first value for the first parameter and the value for each of the one or more other parameters, the supersaturated design for the experiment that is a design that distributes each of the factors into one of the groups. The device outputs an indication of the supersaturated design.

30 Claims, 25 Drawing Sheets

(56) References Cited

U.S. PATENT DOCUMENTS

2018/0060469 A1 3/2018 Morgan et al.

OTHER PUBLICATIONS

Jones, Bradley, and Christopher J. Nachtsheim. "Effective design-based model selection for definitive screening designs." Technometrics 59, No. 3 (2017): 319-329. (Year: 2017).*

Jones, Bradley, and Christopher J. Nachtsheim. "A class of three-level designs for definitive screening in the presence of second-order effects." Journal of Quality Technology 43, No. 1 (2011): 1-15. (Year: 2011).*

Jones, Bradley A., William Li, Christopher J. Nachtsheim, and Q. Ye Kenny. "Model-robust supersaturated and partially supersaturated designs." Journal of Statistical Planning and Inference 139, No. 1 (2009): 45-53. (Year: 2009).*

Gupta, V. K., Rajender Parsad, Basudev Kole, and Lalmohan Bhar. "Computer-generated efficient two-level supersaturated designs." J. Ind. Soc. Agril. Statist 62, No. 2 (2008): 183-194. (Year: 2008).*

Georgiou, Stelios D. "Supersaturated designs: A review of their construction and analysis." Journal of Statistical Planning and Inference 144 (2014): 92-109. (Year: 2014).*

Errore, Anna, Bradley Jones, William Li, and Christopher J. Nachtsheim. "Using definitive screening designs to identify active first-and second-order factor effects." Journal of Quality Technology 49, No. 3 (2017): 244-264. (Year: 2017).*

Jones, B. et al., "Construction, Properties, and Analysis of Group-Orthogonal Supersaturated Designs", Technometrics, Sep. 17, 2019, pp. 1-13, Taylor & Francis.

* cited by examiner

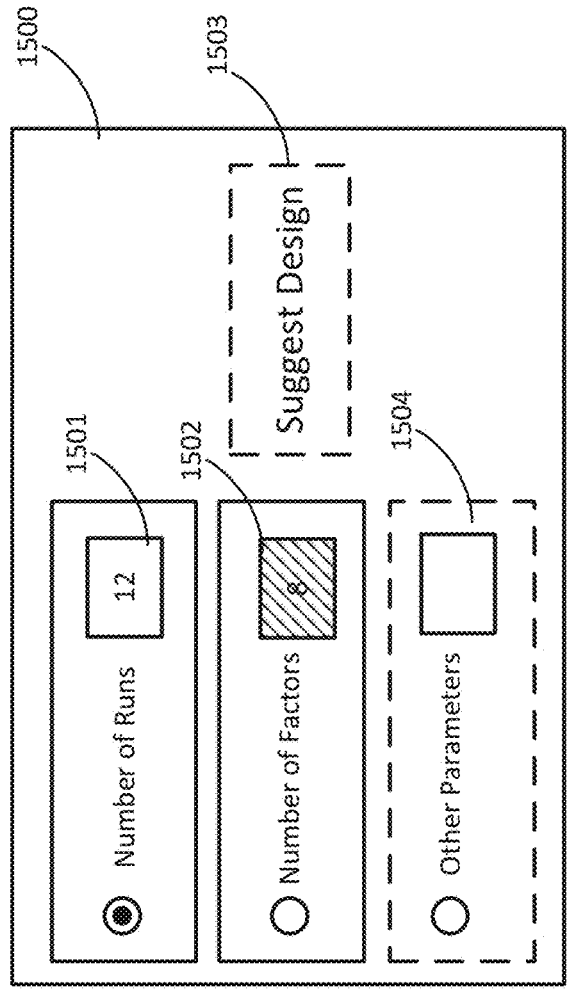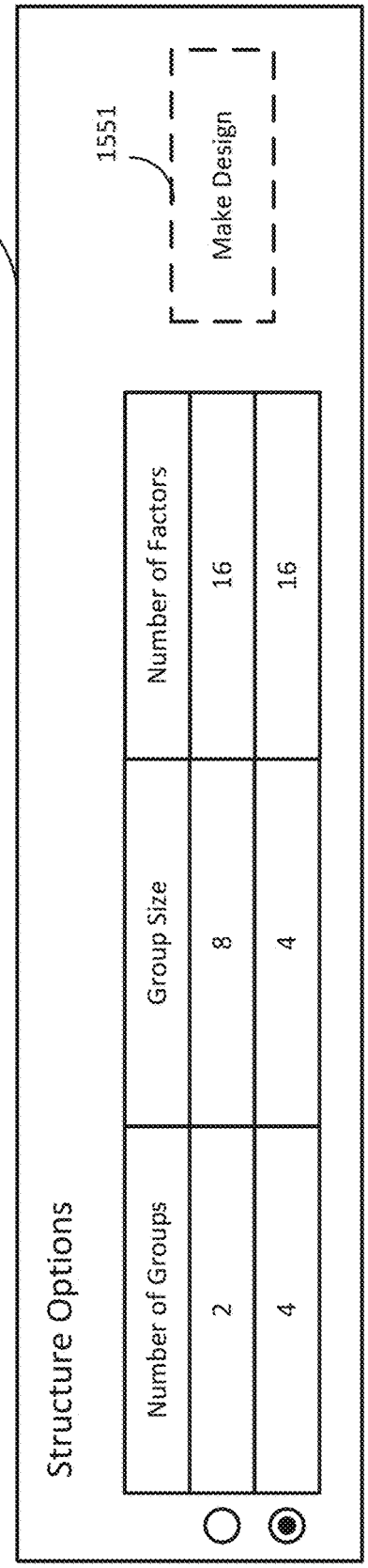

|    | A      | B      | C      | X5     | X2     | X3     |
|----|--------|--------|--------|--------|--------|--------|
| A  | 1.0000 | 0.5000 | 0.5000 | 0.0000 | 0.0000 | 0.0000 |
| B  | 0.5000 | 1.0000 | 0.5000 | 0.0000 | 0.0000 | 0.0000 |
| C  | 0.5000 | 0.5000 | 1.0000 | 0.0000 | 0.0000 | 0.0000 |
| X5 | 0.0000 | 0.0000 | 0.0000 | 1.0000 | 0.3333 | 0.3333 |
| X2 | 0.0000 | 0.0000 | 0.0000 | 0.3333 | 1.0000 | 0.3333 |
| X3 | 0.0000 | 0.0000 | 0.0000 | 0.3333 | 0.3333 | 1.0000 |
| X4 | 0.0000 | 0.0000 | 0.0000 | 0.3333 | 0.3333 | 0.3333 |

FIG. 19

| Factor Name 2010 | Role 2012 | Lower 2014 | Upper 2016 |
|---|---|---|---|
| Intercept | Continuous | 1 | 1 |
| Impact Duration | Discrete Numeric | .001 | .002 |
| Material Type | Discrete Categorical | glass | plastic |
| Impact Pressure | Continuous | 0 | 1000 |
| X4 | Continuous | -1 | 1 |
| X5 | Continuous | -1 | 1 |
| X6 | Continuous | -1 | 1 |
| X7 | Continuous | -1 | 1 |
| X8 | Continuous | -1 | 1 |

FIG. 20

| Run | Const. | P | P | P | A | B | C | D | E | F | G | H | I | J | K | L |
|---|---|---|---|---|---|---|---|---|---|---|---|---|---|---|---|---|
| 1 | 1 | -1 | -1 | -1 | 1 | 1 | 1 | 1 | 1 | 1 | 1 | 1 | 1 | 1 | 1 | 1 |
| 2 | 1 | 1 | -1 | -1 | -1 | -1 | -1 | -1 | -1 | -1 | -1 | -1 | -1 | -1 | -1 | -1 |
| 3 | 1 | -1 | 1 | -1 | -1 | -1 | -1 | -1 | -1 | -1 | -1 | -1 | -1 | -1 | -1 | -1 |
| 4 | 1 | -1 | -1 | 1 | -1 | -1 | -1 | -1 | -1 | -1 | -1 | -1 | -1 | -1 | -1 | -1 |
| 5 | 1 | 1 | 1 | -1 | 1 | 1 | 1 | 1 | 1 | 1 | 1 | 1 | 1 | 1 | 1 | 1 |
| 6 | 1 | 1 | -1 | 1 | 1 | 1 | 1 | 1 | 1 | 1 | 1 | 1 | 1 | 1 | 1 | 1 |
| 7 | 1 | -1 | 1 | 1 | 1 | 1 | 1 | 1 | 1 | 1 | 1 | 1 | 1 | 1 | 1 | 1 |
| 8 | 1 | 1 | 1 | 1 | -1 | -1 | -1 | -1 | -1 | -1 | -1 | -1 | -1 | -1 | -1 | -1 |
| 9 | 1 | -1 | -1 | -1 | 1 | 1 | 1 | 1 | 1 | 1 | 1 | 1 | 1 | 1 | 1 | 1 |
| 10 | 1 | 1 | -1 | -1 | -1 | -1 | -1 | -1 | -1 | -1 | -1 | -1 | -1 | -1 | -1 | -1 |
| 11 | 1 | -1 | 1 | -1 | -1 | -1 | -1 | -1 | -1 | -1 | -1 | -1 | -1 | -1 | -1 | -1 |
| 12 | 1 | -1 | -1 | 1 | 1 | 1 | 1 | 1 | 1 | 1 | 1 | 1 | 1 | 1 | 1 | 1 |

Fit Group Orthogonal Supersaturated for Y

Group 1

Group 2

| Term | Estimate | Std Error | t Ratio | Prob>|t| |
|---|---|---|---|---|
| X5 | 4.0622 | 0.2218 | 18.311 | <.0001* |
| X6 | 6.1315 | 0.2218 | 27.638 | <.0001* |

Group 3

Group 4

| Term | Estimate | Std Error | t Ratio | Prob>|t| |
|---|---|---|---|---|
| X15 | 3.9105 | 0.2092 | 18.696 | <.0001* |

FIG. 24B

Combined Model Parameter Estimates

| Term | Estimate | Std Error | t Ratio | Prob>|t| |
|---|---|---|---|---|
| X5 | 4.0622 | 0.2629 | 15.453 | <.0001* |
| X6 | 6.1315 | 0.2629 | 23.325 | <.0001* |
| X15 | 3.9105 | 0.2478 | 15.779 | <.0001* |

RMSE 0.8585   DF 8

Make Model   Run Model

TOOL FOR DESIGN AND ANALYSIS OF GROUPED SUPERSATURATED DESIGNS

RELATED APPLICATIONS

This application claims the benefit of U.S. Provisional Application No. 62/861,563, filed Jun. 14, 2019, the disclosures of each of which are incorporated herein by reference in their entirety.

BACKGROUND

Experimenters in designing an experiment will sometimes employ a screening design to help identify what potential factors in the experiment may be active factors in determining an outcome of the experiment. A supersaturated design for an experiment is one in which the number of factors investigated in the experiment is larger than the number of test cases. Supersaturated designs are presently underused or avoided by experimenters because these designs cannot estimate all factors for an experiment simultaneously, and it can be difficult to identify active factors using current model selection techniques.

SUMMARY

In an example embodiment, a computer-program product tangibly embodied in a non-transitory machine-readable storage medium is provided. The computer-program product includes instructions to cause a computing device to output an indication for a supersaturated design. The computing device receives a request for a design of an experiment. The design of the experiment comprises a plurality of test cases, each test case of the plurality of test cases comprises multiple test conditions for testing one of different factors for the experiment. A test condition of the multiple test conditions comprises one of different options for a given factor in the design of the experiment. The computing device receives a first value for a first parameter of multiple parameters for the design of the experiment. The multiple parameters indicate a total number of the plurality of test cases for the design of the experiment, a total number of the different factors for the design of the experiment and a total number of different groups for grouping factors of the different factors. The computing device generates a respective value for each of one or more other parameters of the multiple parameters such that the design of the experiment according to the multiple parameters is a supersaturated design where the total number of the different factors is greater than the total number of the plurality of test cases. The one or more other parameters of the multiple parameters are different than the first parameter. The computing device generates, based on the first value for the first parameter and the respective value for each of the one or more other parameters, the supersaturated design for the design of the experiment that is a design that distributes each of the different factors into one of the different groups. The computing device outputs, to an output device, an indication of the supersaturated design.

In another example embodiment, a computing device is provided. The computing device includes, but is not limited to, a processor and memory. The memory contains instructions that when executed by the processor control the computing device to output an indication for a supersaturated design.

In another example embodiment, a method of outputting an indication for a supersaturated design is provided.

Other features and aspects of example embodiments are presented below in the Detailed Description when read in connection with the drawings presented with this application.

BRIEF DESCRIPTION OF THE DRAWINGS

FIGS. 15A-B illustrate graphical user interfaces for generating a supersaturated design in at least one embodiment of the present technology.

FIG. 19 illustrates an indication of correlation between a portion of factors of a generated supersaturated design in at least one embodiment of the present technology.

FIG. 20 illustrates a graphical user interface for customizing factors for a supersaturated design in at least one embodiment of the present technology.

FIG. 22B illustrates a generated supersaturated design in at least one embodiment of the present technology.

FIGS. 24A-24B illustrate graphical user interfaces for an analysis of a supersaturated design at least one embodiment of the present technology.

DETAILED DESCRIPTION

In the following description, for the purposes of explanation, specific details are set forth in order to provide a thorough understanding of embodiments of the technology. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the example embodiments will provide those skilled in the art with an enabling description for implementing an example embodiment. It should be understood that various changes may be made in the function and arrangement of elements without departing from the spirit and scope of the technology as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional operations not included in a figure. A process may correspond to a method, a function, a procedure, a subroutine, a subprogram, etc. When a process corresponds to a function, its termination can correspond to a return of the function to the calling function or the main function.

Systems depicted in some of the figures may be provided in various configurations. In some embodiments, the systems may be configured as a distributed system where one or more components of the system are distributed across one or more networks in a cloud computing system.

Figure 1:
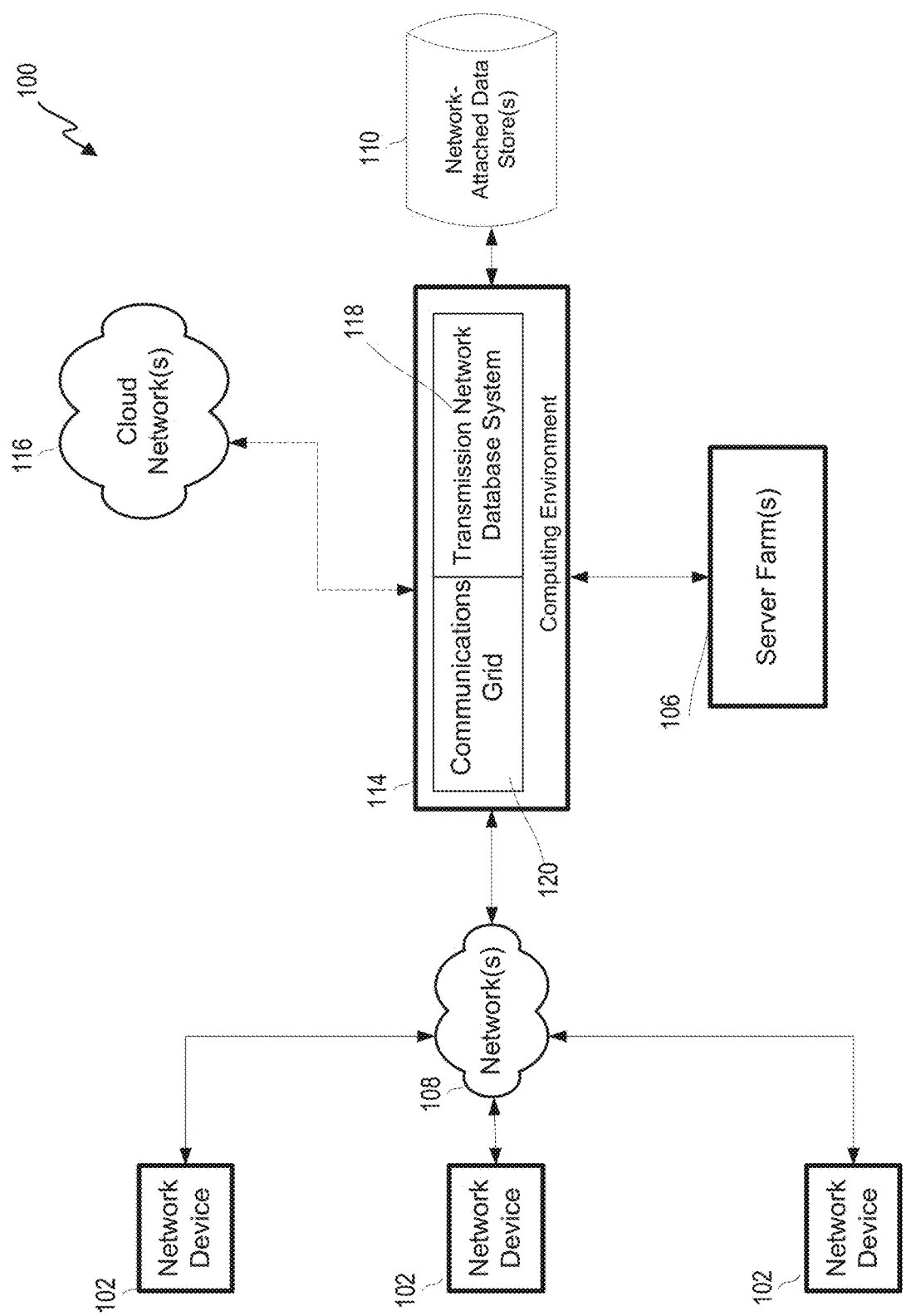
FIG. 1 illustrates a block diagram that provides an illustration of the hardware components of a computing system, according to at least one embodiment of the present technology.

FIG. 1 is a block diagram that provides an illustration of the hardware components of a data transmission network 100, according to embodiments of the present technology. Data transmission network 100 is a specialized computer system that may be used for processing large amounts of data where a large number of computer processing cycles are required.

Data transmission network 100 may also include computing environment 114. Computing environment 114 may be a specialized computer or other machine that processes the data received within the data transmission network 100. Data transmission network 100 also includes one or more network devices 102. Network devices 102 may include client devices that attempt to communicate with computing environment 114. For example, network devices 102 may send data to the computing environment 114 to be processed, may send signals to the computing environment 114 to control different aspects of the computing environment or the data it is processing, among other reasons. Network devices 102 may interact with the computing environment 114 through a number of ways, such as, for example, over one or more networks 108. As shown in FIG. 1, computing environment 114 may include one or more other systems. For example, computing environment 114 may include a database system 118 and/or a communications grid 120.

Figure 8:
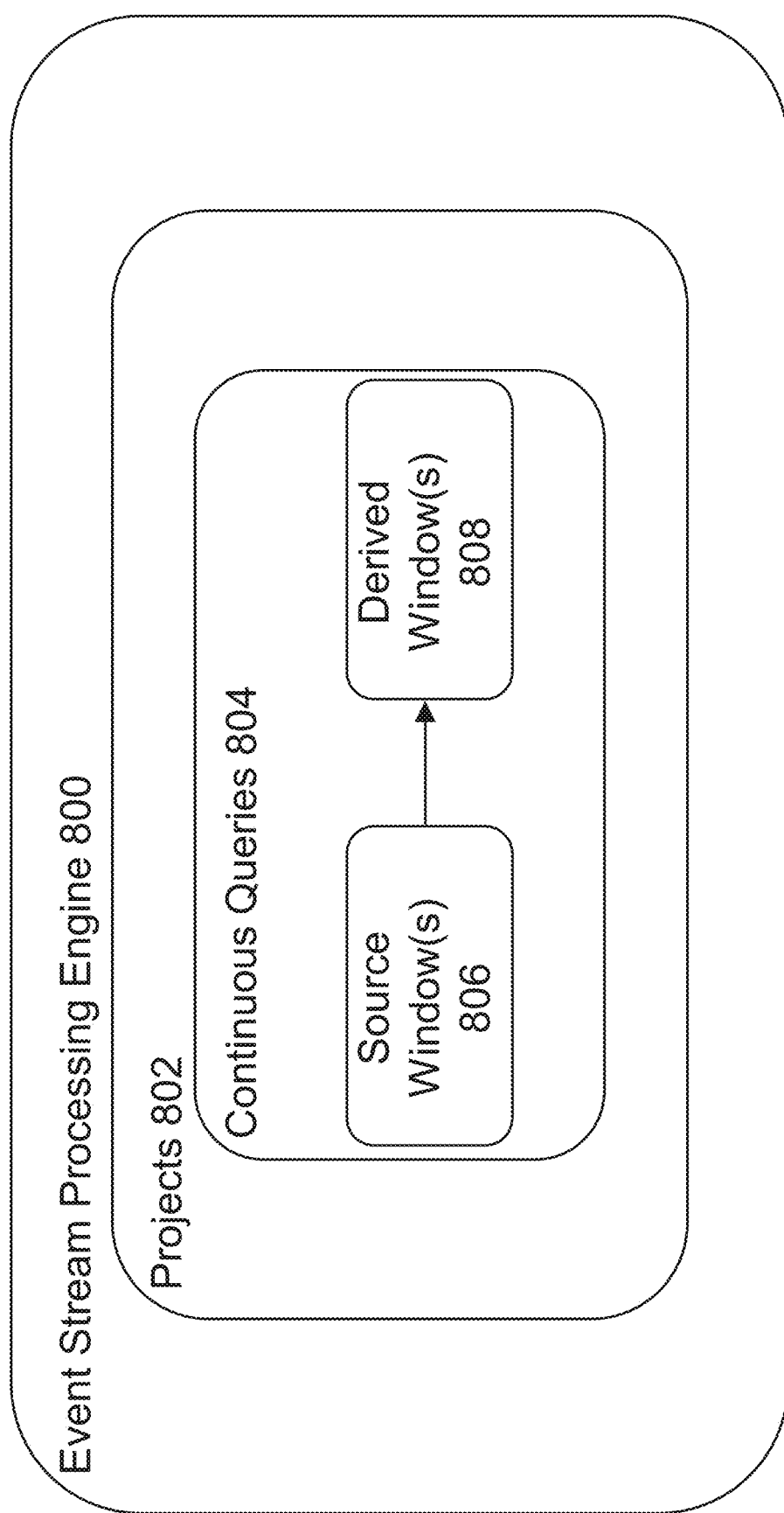
FIG. 8 illustrates a block diagram including components of an Event Stream Processing Engine (ESPE), according to at least one embodiment of the present technology.
Figure 9:
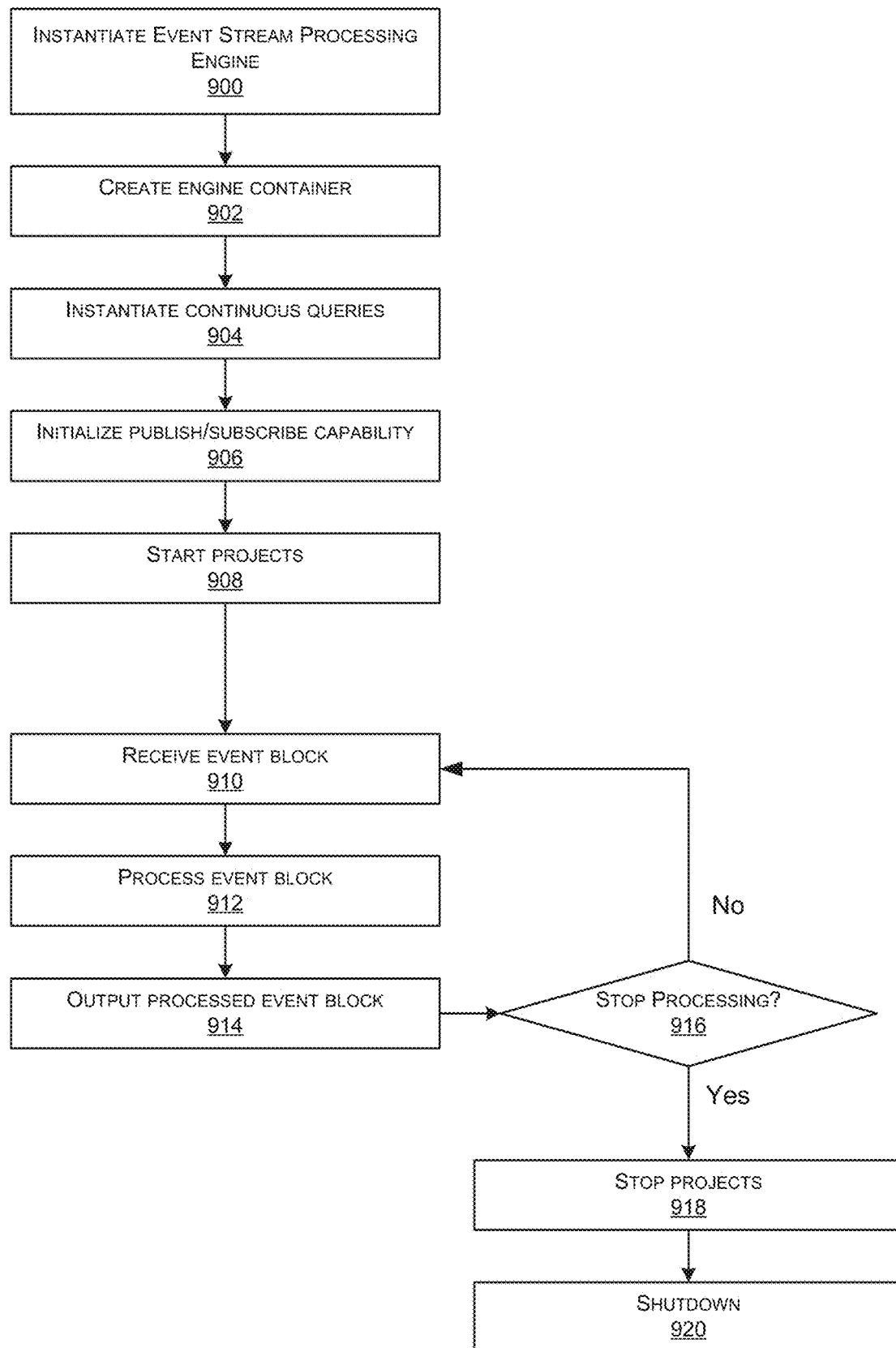
FIG. 9 illustrates a flow chart showing an example process including operations performed by an event stream processing engine, according to at least one embodiment of the present technology.
Figure 10:
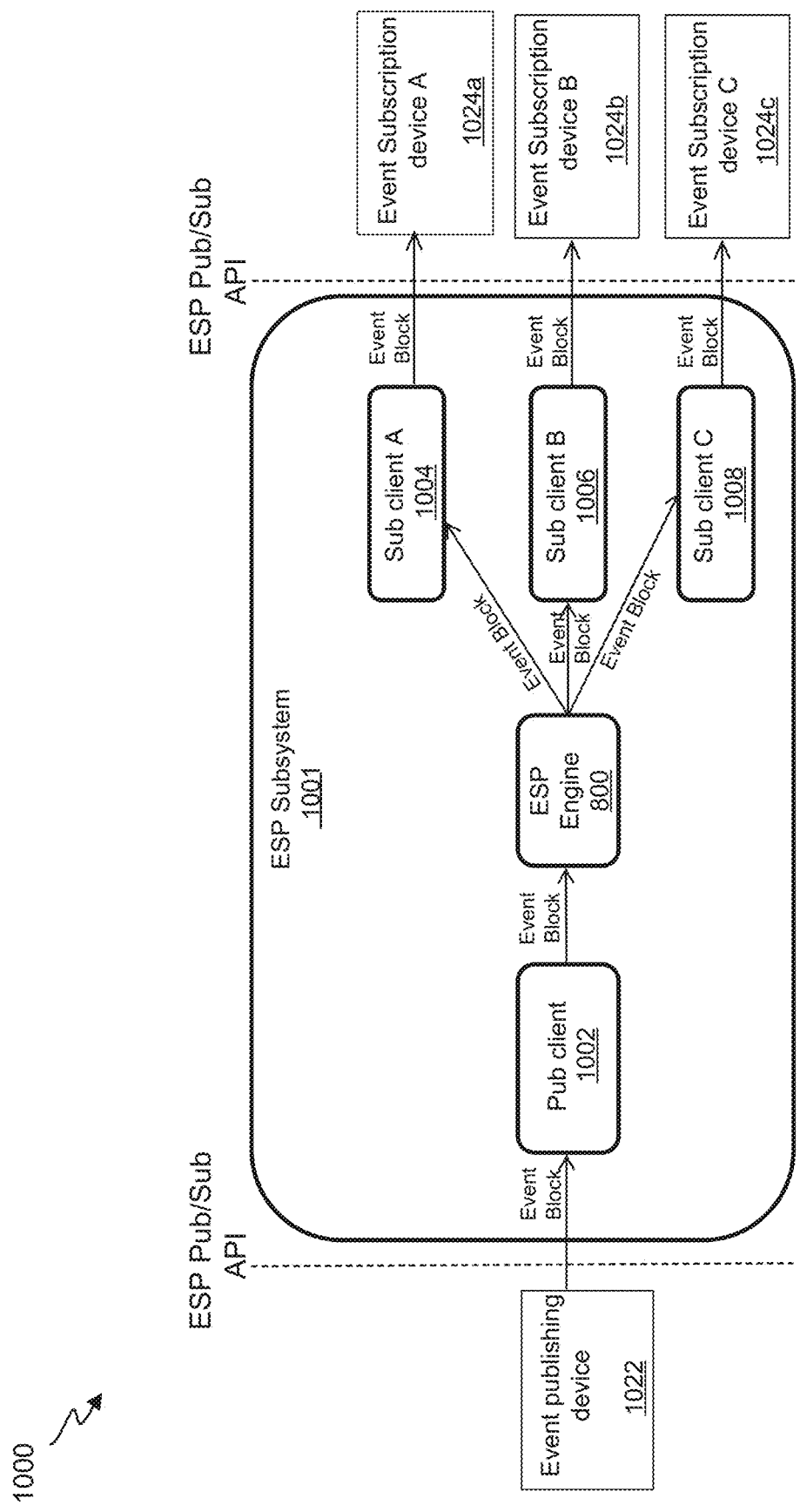
FIG. 10 illustrates an ESP system interfacing between a publishing device and multiple event subscribing devices, according to at least one embodiment of the present technology.

In other embodiments, network devices may provide a large amount of data, either all at once or streaming over a period of time (e.g., using event stream processing (ESP), described further with respect to FIGS. 8-10), to the computing environment 114 via networks 108. For example, network devices 102 may include network computers, sensors, databases, or other devices that may transmit or otherwise provide data to computing environment 114. For example, network devices may include local area network devices, such as routers, hubs, switches, or other computer networking devices. These devices may provide a variety of stored or generated data, such as network data or data specific to the network devices themselves. Network devices may also include sensors that monitor their environment or other devices to collect data regarding that environment or those devices, and such network devices may provide data they collect over time. Network devices may also include devices within the internet of things, such as devices within a home automation network. Some of these devices may be referred to as edge devices, and may involve edge computing circuitry. Data may be transmitted by network devices directly to computing environment 114 or to network-attached data stores, such as network-attached data stores 110 for storage so that the data may be retrieved later by the computing environment 114 or other portions of data transmission network 100.

Data transmission network 100 may also include one or more network-attached data stores 110. Network-attached data stores 110 are used to store data to be processed by the computing environment 114 as well as any intermediate or final data generated by the computing system in non-volatile memory. However in certain embodiments, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated on-the-fly. In this non-limiting situation, the computing environment 114 may be configured to retain the processed information within memory so that responses can be generated for the user at different levels of detail as well as allow a user to interactively query against this information.

Network-attached data stores may store a variety of different types of data organized in a variety of different ways and from a variety of different sources. For example, network-attached data storage may include storage other than primary storage located within computing environment 114 that is directly accessible by processors located therein. Network-attached data storage may include secondary, tertiary or auxiliary storage, such as large hard drives, servers, virtual memory, among other types. Storage devices may include portable or non-portable storage devices, optical storage devices, and various other mediums capable of storing, containing data. A machine-readable storage medium or computer-readable storage medium may include a non-transitory medium in which data can be stored and that does not include carrier waves and/or transitory electronic signals. Examples of a non-transitory medium may include, for example, a magnetic disk or tape, optical storage media such as compact disk or digital versatile disk, flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, among others. Furthermore, the data stores may hold a variety of different types of data. For example, network-attached data stores 110 may hold unstructured (e.g., raw) data, such as manufacturing data (e.g., a database containing records identifying products being manufactured with parameter data for each product, such as colors and models) or product sales databases (e.g., a database containing individual data records identifying details of individual product sales).

The unstructured data may be presented to the computing environment 114 in different forms such as a flat file or a conglomerate of data records, and may have data values and accompanying time stamps. The computing environment 114 may be used to analyze the unstructured data in a variety of ways to determine the best way to structure (e.g., hierarchically) that data, such that the structured data is tailored to a type of further analysis that a user wishes to perform on the data. For example, after being processed, the unstructured time stamped data may be aggregated by time (e.g., into daily time period units) to generate time series data and/or structured hierarchically according to one or more dimensions (e.g., parameters, attributes, and/or variables). For example, data may be stored in a hierarchical data structure, such as a ROLAP OR MOLAP database, or may be stored in another tabular form, such as in a flat-hierarchy form.

Data transmission network 100 may also include one or more server farms 106. Computing environment 114 may route select communications or data to the one or more sever farms 106 or one or more servers within the server farms. Server farms 106 can be configured to provide information in a predetermined manner. For example, server farms 106 may access data to transmit in response to a communication. Server farms 106 may be separately housed from each other device within data transmission network 100, such as computing environment 114, and/or may be part of a device or system.

Server farms 106 may host a variety of different types of data processing as part of data transmission network 100. Server farms 106 may receive a variety of different data from network devices, from computing environment 114, from cloud network 116, or from other sources. The data may have been obtained or collected from one or more sensors, as inputs from a control database, or may have been received as inputs from an external system or device. Server farms 106 may assist in processing the data by turning raw data into processed data based on one or more rules implemented by the server farms. For example, sensor data may be analyzed to determine changes in an environment over time or in real-time.

Data transmission network 100 may also include one or more cloud networks 116. Cloud network 116 may include a cloud infrastructure system that provides cloud services. In certain embodiments, services provided by the cloud network 116 may include a host of services that are made available to users of the cloud infrastructure system on demand. Cloud network 116 is shown in FIG. 1 as being connected to computing environment 114 (and therefore having computing environment 114 as its client or user), but cloud network 116 may be connected to or utilized by any of the devices in FIG. 1. Services provided by the cloud network can dynamically scale to meet the needs of its users. The cloud network 116 may include one or more computers, servers, and/or systems. In some embodiments, the computers, servers, and/or systems that make up the cloud network 116 are different from the user's own on-premises computers, servers, and/or systems. For example, the cloud network 116 may host an application, and a user may, via a communication network such as the Internet, on demand, order and use the application.

While each device, server and system in FIG. 1 is shown as a single device, it will be appreciated that multiple devices may instead be used. For example, a set of network devices can be used to transmit various communications from a single user, or remote server 140 may include a server stack. As another example, data may be processed as part of computing environment 114.

Each communication within data transmission network 100 (e.g., between client devices, between a device and connection management system 150, between servers 106 and computing environment 114 or between a server and a device) may occur over one or more networks 108. Networks 108 may include one or more of a variety of different types of networks, including a wireless network, a wired network, or a combination of a wired and wireless network. Examples of suitable networks include the Internet, a personal area network, a local area network (LAN), a wide area network (WAN), or a wireless local area network (WLAN). A wireless network may include a wireless interface or combination of wireless interfaces. As an example, a network in the one or more networks 108 may include a short-range communication channel, such as a Bluetooth or a Bluetooth Low Energy channel. A wired network may include a wired interface. The wired and/or wireless networks may be implemented using routers, access points, bridges, gateways, or the like, to connect devices in the network 114, as will be further described with respect to FIG. 2. The one or more networks 108 can be incorporated entirely within or can include an intranet, an extranet, or a combination thereof. In one embodiment, communications between two or more systems and/or devices can be achieved by a secure communications protocol, such as secure sockets layer (SSL) or transport layer security (TLS). In addition, data and/or transactional details may be encrypted.

Some aspects may utilize the Internet of Things (IoT), where things (e.g., machines, devices, phones, sensors) can be connected to networks and the data from these things can be collected and processed within the things and/or external to the things. For example, the IoT can include sensors in many different devices, and high value analytics can be applied to identify hidden relationships and drive increased efficiencies. This can apply to both big data analytics and real-time (e.g., ESP) analytics. IoT may be implemented in various areas, such as for access (technologies that get data and move it), embed-ability (devices with embedded sensors), and services. Industries in the IoT space may automotive (connected car), manufacturing (connected factory), smart cities, energy and retail. This will be described further below with respect to FIG. 2.

As noted, computing environment 114 may include a communications grid 120 and a transmission network database system 118. Communications grid 120 may be a grid-based computing system for processing large amounts of data. The transmission network database system 118 may be for managing, storing, and retrieving large amounts of data that are distributed to and stored in the one or more network-attached data stores 110 or other data stores that reside at different locations within the transmission network database system 118. The compute nodes in the grid-based computing system 120 and the transmission network database system 118 may share the same processor hardware, such as processors that are located within computing environment 114.

Figure 2:
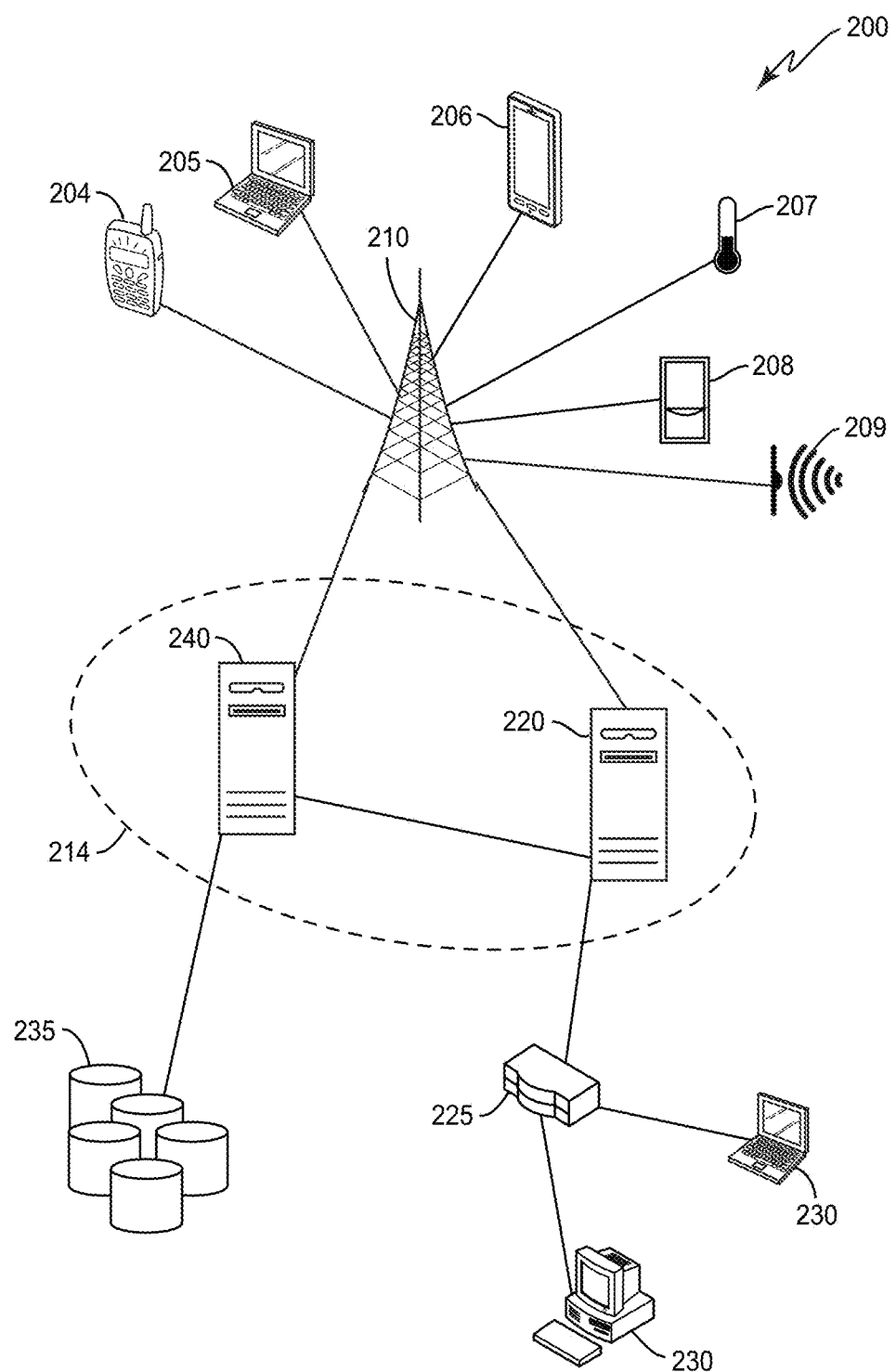
FIG. 2 illustrates an example network including an example set of devices communicating with each other over an exchange system and via a network, according to at least one embodiment of the present technology.

FIG. 2 illustrates an example network including an example set of devices communicating with each other over an exchange system and via a network, according to embodiments of the present technology. As noted, each communication within data transmission network 100 may occur over one or more networks. System 200 includes a network device 204 configured to communicate with a variety of types of client devices, for example client devices 230, over a variety of types of communication channels.

As shown in FIG. 2, network device 204 can transmit a communication over a network (e.g., a cellular network via a base station 210). The communication can be routed to another network device, such as network devices 205-209, via base station 210. The communication can also be routed to computing environment 214 via base station 210. For example, network device 204 may collect data either from its surrounding environment or from other network devices (such as network devices 205-209) and transmit that data to computing environment 214.

Although network devices 204-209 are shown in FIG. 2 as a mobile phone, laptop computer, tablet computer, temperature sensor, motion sensor, and audio sensor respectively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, flow rate sensors, among others. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, electrical current, among others. The sensors may be mounted to various components used as part of a variety of different types of systems (e.g., an oil drilling operation). The network devices may detect and record data related to the environment that it monitors, and transmit that data to computing environment 214.

As noted, one type of system that may include various sensors that collect data to be processed and/or transmitted to a computing environment according to certain embodiments includes an oil drilling system. For example, the one or more drilling operation sensors may include surface sensors that measure a hook load, a fluid rate, a temperature and a density in and out of the wellbore, a standpipe pressure, a surface torque, a rotation speed of a drill pipe, a rate of penetration, a mechanical specific energy, etc. and downhole sensors that measure a rotation speed of a bit, fluid densities, downhole torque, downhole vibration (axial, tangential, lateral), a weight applied at a drill bit, an annular pressure, a differential pressure, an azimuth, an inclination, a dog leg severity, a measured depth, a vertical depth, a downhole temperature, etc. Besides the raw data collected directly by the sensors, other data may include parameters either developed by the sensors or assigned to the system by a client or other controlling device. For example, one or more drilling operation control parameters may control settings such as a mud motor speed to flow ratio, a bit diameter, a predicted formation top, seismic data, weather data, etc. Other data may be generated using physical models such as an earth model, a weather model, a seismic model, a bottom hole assembly model, a well plan model, an annular friction model, etc. In addition to sensor and control settings, predicted outputs, of for example, the rate of penetration, mechanical specific energy, hook load, flow in fluid rate, flow out fluid rate, pump pressure, surface torque, rotation speed of the drill pipe, annular pressure, annular friction pressure, annular temperature, equivalent circulating density, etc. may also be stored in the data warehouse.

In another example, another type of system that may include various sensors that collect data to be processed and/or transmitted to a computing environment according to certain embodiments includes a home automation or similar automated network in a different environment, such as an office space, school, public space, sports venue, or a variety of other locations. Network devices in such an automated network may include network devices that allow a user to access, control, and/or configure various home appliances located within the user's home (e.g., a television, radio, light, fan, humidifier, sensor, microwave, iron, and/or the like), or outside of the user's home (e.g., exterior motion sensors, exterior lighting, garage door openers, sprinkler systems, or the like). For example, network device 102 may include a home automation switch that may be coupled with a home appliance. In another embodiment, a network device can allow a user to access, control, and/or configure devices, such as office-related devices (e.g., copy machine, printer, or fax machine), audio and/or video related devices (e.g., a receiver, a speaker, a projector, a DVD player, or a television), media-playback devices (e.g., a compact disc player, a CD player, or the like), computing devices (e.g., a home computer, a laptop computer, a tablet, a personal digital assistant (PDA), a computing device, or a wearable device), lighting devices (e.g., a lamp or recessed lighting), devices associated with a security system, devices associated with an alarm system, devices that can be operated in an automobile (e.g., radio devices, navigation devices), and/or the like. Data may be collected from such various sensors in raw form, or data may be processed by the sensors to create parameters or other data either developed by the sensors based on the raw data or assigned to the system by a client or other controlling device.

In another example, another type of system that may include various sensors that collect data to be processed and/or transmitted to a computing environment according to certain embodiments includes a power or energy grid. A variety of different network devices may be included in an energy grid, such as various devices within one or more power plants, energy farms (e.g., wind farm, solar farm, among others) energy storage facilities, factories, homes and businesses of consumers, among others. One or more of such devices may include one or more sensors that detect energy gain or loss, electrical input or output or loss, and a variety of other efficiencies. These sensors may collect data to inform users of how the energy grid, and individual devices within the grid, may be functioning and how they may be made more efficient.

Network device sensors may also perform processing on data it collects before transmitting the data to the computing environment 114, or before deciding whether to transmit data to the computing environment 114. For example, network devices may determine whether data collected meets certain rules, for example by comparing data or values calculated from the data and comparing that data to one or more thresholds. The network device may use this data and/or comparisons to determine if the data should be transmitted to the computing environment 214 for further use or processing.

Computing environment 214 may include machines 220 and 240. Although computing environment 214 is shown in FIG. 2 as having two machines, 220 and 240, computing environment 214 may have only one machine or may have more than two machines. The machines that make up computing environment 214 may include specialized computers, servers, or other machines that are configured to individually and/or collectively process large amounts of data. The computing environment 214 may also include storage devices that include one or more databases of structured data, such as data organized in one or more hierarchies, or unstructured data. The databases may communicate with the processing devices within computing environment 214 to distribute data to them. Since network devices may transmit data to computing environment 214, that data may be received by the computing environment 214 and subsequently stored within those storage devices. Data used by computing environment 214 may also be stored in data stores 235, which may also be a part of or connected to computing environment 214.

Computing environment 214 can communicate with various devices via one or more routers 225 or other inter-network or intra-network connection components. For example, computing environment 214 may communicate with devices 230 via one or more routers 225. Computing environment 214 may collect, analyze and/or store data from or pertaining to communications, client device operations, client rules, and/or user-associated actions stored at one or more data stores 235. Such data may influence communication routing to the devices within computing environment 214, how data is stored or processed within computing environment 214, among other actions.

Notably, various other devices can further be used to influence communication routing and/or processing between devices within computing environment 214 and with devices outside of computing environment 214. For example, as shown in FIG. 2, computing environment 214 may include a web server 240. Thus, computing environment 214 can retrieve data of interest, such as client information (e.g., product information, client rules, etc.), technical product details, news, current or predicted weather, and so on.

In addition to computing environment 214 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices may receive data periodically from network device sensors as the sensors continuously sense, monitor and track changes in their environments. Devices within computing environment 214 may also perform pre-analysis on data it receives to determine if the data received should be processed as part of an ongoing project. The data received and collected by computing environment 214, no matter what the source or method or timing of receipt, may be processed over a period of time for a client to determine results data based on the client's needs and rules.

Figure 3:
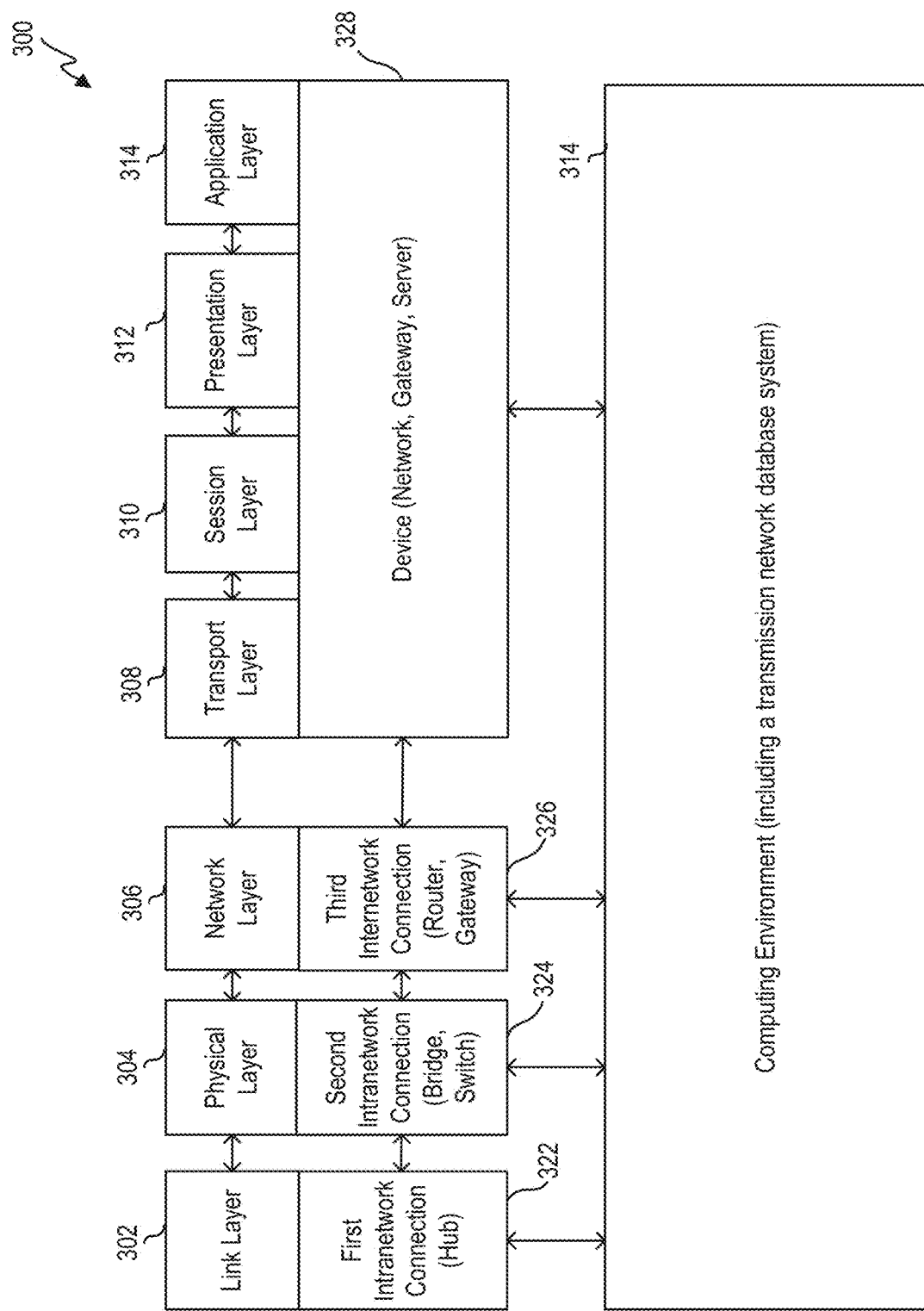
FIG. 3 illustrates a representation of a conceptual model of a communications protocol system, according to at least one embodiment of the present technology.

FIG. 3 illustrates a representation of a conceptual model of a communications protocol system, according to embodiments of the present technology. More specifically, FIG. 3 identifies operation of a computing environment in an Open Systems Interaction model that corresponds to various connection components. The model 300 shows, for example, how a computing environment, such as computing environment 314 (or computing environment 214 in FIG. 2) may communicate with other devices in its network, and control how communications between the computing environment and other devices are executed and under what conditions.

The model can include layers 302-314. The layers are arranged in a stack. Each layer in the stack serves the layer one level higher than it (except for the application layer, which is the highest layer), and is served by the layer one level below it (except for the physical layer, which is the lowest layer). The physical layer is the lowest layer because it receives and transmits raw bites of data, and is the farthest layer from the user in a communications system. On the other hand, the application layer is the highest layer because it interacts directly with a software application.

As noted, the model includes a physical layer 302. Physical layer 302 represents physical communication, and can define parameters of that physical communication. For example, such physical communication may come in the form of electrical, optical, or electromagnetic signals. Physical layer 302 also defines protocols that may control communications within a data transmission network.

Link layer 304 defines links and mechanisms used to transmit (i.e., move) data across a network. The link layer manages node-to-node communications, such as within a grid computing environment. Link layer 304 can detect and correct errors (e.g., transmission errors in the physical layer 302). Link layer 304 can also include a media access control (MAC) layer and logical link control (LLC) layer.

Network layer 306 defines the protocol for routing within a network. In other words, the network layer coordinates transferring data across nodes in a same network (e.g., such as a grid computing environment). Network layer 306 can also define the processes used to structure local addressing within the network.

Transport layer 308 can manage the transmission of data and the quality of the transmission and/or receipt of that data. Transport layer 308 can provide a protocol for transferring data, such as, for example, a Transmission Control Protocol (TCP). Transport layer 308 can assemble and disassemble data frames for transmission. The transport layer can also detect transmission errors occurring in the layers below it.

Session layer 310 can establish, maintain, and manage communication connections between devices on a network. In other words, the session layer controls the dialogues or nature of communications between network devices on the network. The session layer may also establish checkpointing, adjournment, termination, and restart procedures.

Presentation layer 312 can provide translation for communications between the application and network layers. In other words, this layer may encrypt, decrypt and/or format data based on data types known to be accepted by an application or network layer.

Application layer 314 interacts directly with software applications and end users, and manages communications between them. Application layer 314 can identify destinations, local resource states or availability and/or communication content or formatting using the applications.

Intra-network connection components 322 and 324 are shown to operate in lower levels, such as physical layer 302 and link layer 304, respectively. For example, a hub can operate in the physical layer, a switch can operate in the physical layer, and a router can operate in the network layer. Inter-network connection components 326 and 328 are shown to operate on higher levels, such as layers 306-314. For example, routers can operate in the network layer and network devices can operate in the transport, session, presentation, and application layers.

As noted, a computing environment 314 can interact with and/or operate on, in various embodiments, one, more, all or any of the various layers. For example, computing environment 314 can interact with a hub (e.g., via the link layer) so as to adjust which devices the hub communicates with. The physical layer may be served by the link layer, so it may implement such data from the link layer. For example, the computing environment 314 may control which devices it will receive data from. For example, if the computing environment 314 knows that a certain network device has turned off, broken, or otherwise become unavailable or unreliable, the computing environment 314 may instruct the hub to prevent any data from being transmitted to the computing environment 314 from that network device. Such a process may be beneficial to avoid receiving data that is inaccurate or that has been influenced by an uncontrolled environment. As another example, computing environment 314 can communicate with a bridge, switch, router or gateway and influence which device within the system (e.g., system 200) the component selects as a destination. In some embodiments, computing environment 314 can interact with various layers by exchanging communications with equipment operating on a particular layer by routing or modifying existing communications. In another embodiment, such as in a grid computing environment, a node may determine how data within the environment should be routed (e.g., which node should receive certain data) based on certain parameters or information provided by other layers within the model.

As noted, the computing environment 314 may be a part of a communications grid environment, the communications of which may be implemented as shown in the protocol of FIG. 3. For example, referring back to FIG. 2, one or more of machines 220 and 240 may be part of a communications grid computing environment. A gridded computing environment may be employed in a distributed system with non-interactive workloads where data resides in memory on the machines, or compute nodes. In such an environment, analytic code, instead of a database management system, controls the processing performed by the nodes. Data is co-located by pre-distributing it to the grid nodes, and the analytic code on each node loads the local data into memory. Each node may be assigned a particular task such as a portion of a processing project, or to organize or control other nodes within the grid.

Figure 4:
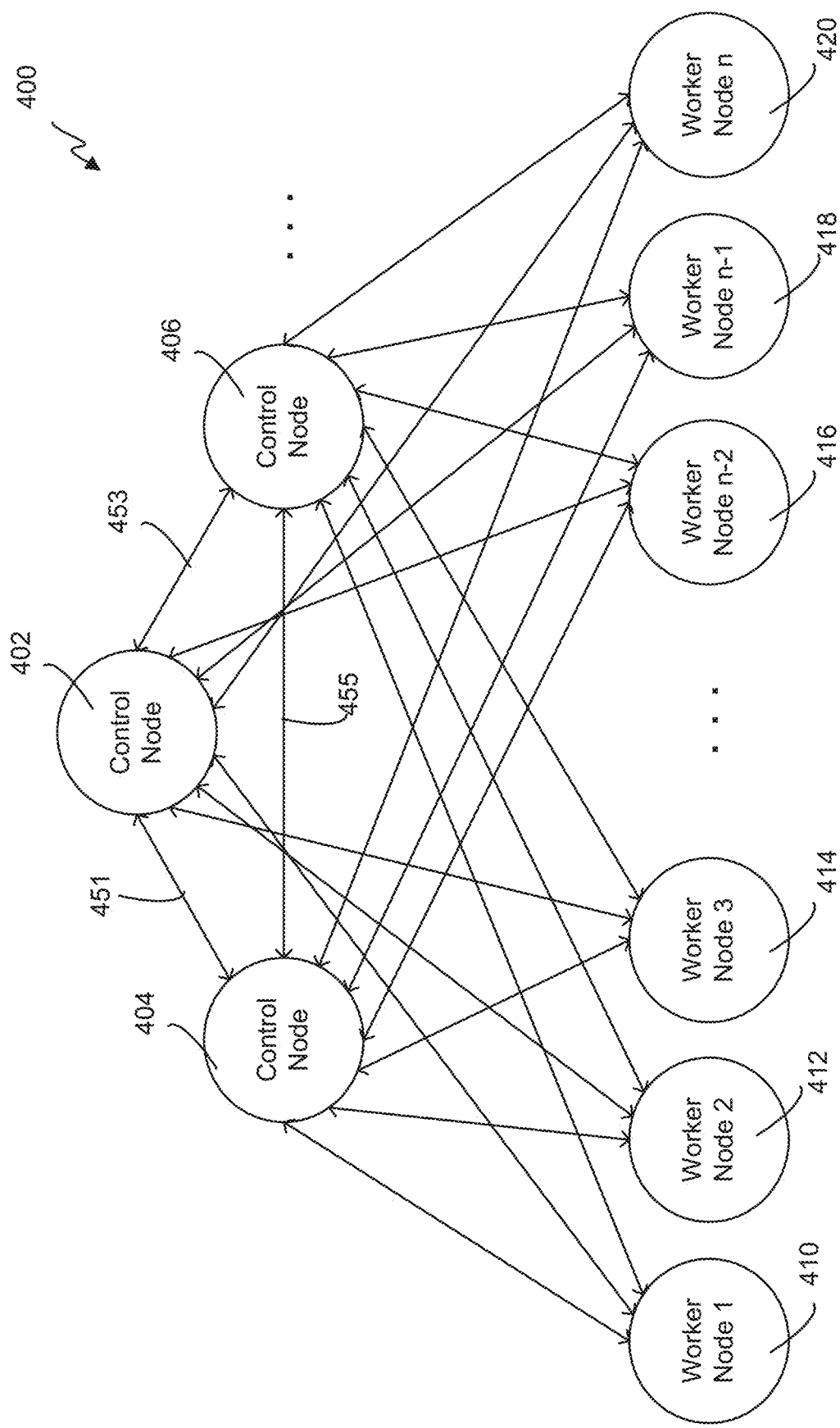
FIG. 4 illustrates a communications grid computing system including a variety of control and worker nodes, according to at least one embodiment of the present technology.

FIG. 4 illustrates a communications grid computing system 400 including a variety of control and worker nodes, according to embodiments of the present technology. Communications grid computing system 400 includes three control nodes and one or more worker nodes. Communications grid computing system 400 includes control nodes 402, 404, and 406. The control nodes are communicatively connected via communication paths 451, 453, and 455. Therefore, the control nodes may transmit information (e.g., related to the communications grid or notifications), to and receive information from each other. Although communications grid computing system 400 is shown in FIG. 4 as including three control nodes, the communications grid may include more or less than three control nodes.

Communications grid computing system (or just "communications grid") 400 also includes one or more worker nodes. Shown in FIG. 4 are six worker nodes 410-420. Although FIG. 4 shows six worker nodes, a communications grid according to embodiments of the present technology may include more or less than six worker nodes. The number of worker nodes included in a communications grid may be dependent upon how large the project or data set is being processed by the communications grid, the capacity of each worker node, the time designated for the communications grid to complete the project, among others. Each worker node within the communications grid 400 may be connected (wired or wirelessly, and directly or indirectly) to control nodes 402-406. Therefore, each worker node may receive information from the control nodes (e.g., an instruction to perform work on a project) and may transmit information to the control nodes (e.g., a result from work performed on a project). Furthermore, worker nodes may communicate with each other (either directly or indirectly). For example, worker nodes may transmit data between each other related to a job being performed or an individual task within a job being performed by that worker node. However, in certain embodiments, worker nodes may not, for example, be connected (communicatively or otherwise) to certain other worker nodes. In an embodiment, worker nodes may only be able to communicate with the control node that controls it, and may not be able to communicate with other worker nodes in the communications grid, whether they are other worker nodes controlled by the control node that controls the worker node, or worker nodes that are controlled by other control nodes in the communications grid.

A control node may connect with an external device with which the control node may communicate (e.g., a grid user, such as a server or computer, may connect to a controller of the grid). For example, a server or computer may connect to control nodes and may transmit a project or job to the node. The project may include a data set. The data set may be of any size. Once the control node receives such a project including a large data set, the control node may distribute the data set or projects related to the data set to be performed by worker nodes. Alternatively, for a project including a large data set, the data set may be receive or stored by a machine other than a control node (e.g., a Hadoop data node).

Control nodes may maintain knowledge of the status of the nodes in the grid (i.e., grid status information), accept work requests from clients, subdivide the work across worker nodes, coordinate the worker nodes, among other responsibilities. Worker nodes may accept work requests from a control node and provide the control node with results of the work performed by the worker node. A grid may be started from a single node (e.g., a machine, computer, server, etc.). This first node may be assigned or may start as the primary control node that will control any additional nodes that enter the grid.

When a project is submitted for execution (e.g., by a client or a controller of the grid) it may be assigned to a set of nodes. After the nodes are assigned to a project, a data structure (i.e., a communicator) may be created. The communicator may be used by the project for information to be shared between the project code running on each node. A communication handle may be created on each node. A handle, for example, is a reference to the communicator that is valid within a single process on a single node, and the handle may be used when requesting communications between nodes.

A control node, such as control node 402, may be designated as the primary control node. A server, computer or other external device may connect to the primary control node. Once the control node receives a project, the primary control node may distribute portions of the project to its worker nodes for execution. For example, when a project is initiated on communications grid 400, primary control node 402 controls the work to be performed for the project in order to complete the project as requested or instructed. The primary control node may distribute work to the worker nodes based on various factors, such as which subsets or portions of projects may be completed most efficiently and in the correct amount of time. For example, a worker node may perform analysis on a portion of data that is already local (e.g., stored on) the worker node. The primary control node also coordinates and processes the results of the work performed by each worker node after each worker node executes and completes its job. For example, the primary control node may receive a result from one or more worker nodes, and the control node may organize (e.g., collect and assemble) the results received and compile them to produce a complete result for the project received from the end user.

Any remaining control nodes, such as control nodes 404 and 406, may be assigned as backup control nodes for the project. In an embodiment, backup control nodes may not control any portion of the project. Instead, backup control nodes may serve as a backup for the primary control node and take over as primary control node if the primary control node were to fail. If a communications grid were to include only a single control node, and the control node were to fail (e.g., the control node is shut off or breaks) then the communications grid as a whole may fail and any project or job being run on the communications grid may fail and may not complete. While the project may be run again, such a failure may cause a delay (severe delay in some cases, such as overnight delay) in completion of the project. Therefore, a grid with multiple control nodes, including a backup control node, may be beneficial.

To add another node or machine to the grid, the primary control node may open a pair of listening sockets, for example. A socket may be used to accept work requests from clients, and the second socket may be used to accept connections from other grid nodes). The primary control node may be provided with a list of other nodes (e.g., other machines, computers, servers) that will participate in the grid, and the role that each node will fill in the grid. Upon startup of the primary control node (e.g., the first node on the grid), the primary control node may use a network protocol to start the server process on every other node in the grid. Command line parameters, for example, may inform each node of one or more pieces of information, such as: the role that the node will have in the grid, the host name of the primary control node, the port number on which the primary control node is accepting connections from peer nodes, among others. The information may also be provided in a configuration file, transmitted over a secure shell tunnel, recovered from a configuration server, among others. While the other machines in the grid may not initially know about the configuration of the grid, that information may also be sent to each other node by the primary control node. Updates of the grid information may also be subsequently sent to those nodes.

For any control node other than the primary control node added to the grid, the control node may open three sockets. The first socket may accept work requests from clients, the second socket may accept connections from other grid members, and the third socket may connect (e.g., permanently) to the primary control node. When a control node (e.g., primary control node) receives a connection from another control node, it first checks to see if the peer node is in the list of configured nodes in the grid. If it is not on the list, the control node may clear the connection. If it is on the list, it may then attempt to authenticate the connection. If authentication is successful, the authenticating node may transmit information to its peer, such as the port number on which a node is listening for connections, the host name of the node, information about how to authenticate the node, among other information. When a node, such as the new control node, receives information about another active node, it will check to see if it already has a connection to that other node. If it does not have a connection to that node, it may then establish a connection to that control node.

Any worker node added to the grid may establish a connection to the primary control node and any other control nodes on the grid. After establishing the connection, it may authenticate itself to the grid (e.g., any control nodes, including both primary and backup, or a server or user controlling the grid). After successful authentication, the worker node may accept configuration information from the control node.

When a node joins a communications grid (e.g., when the node is powered on or connected to an existing node on the grid or both), the node is assigned (e.g., by an operating system of the grid) a universally unique identifier (UUID). This unique identifier may help other nodes and external entities (devices, users, etc.) to identify the node and distinguish it from other nodes. When a node is connected to the grid, the node may share its unique identifier with the other nodes in the grid. Since each node may share its unique identifier, each node may know the unique identifier of every other node on the grid. Unique identifiers may also designate a hierarchy of each of the nodes (e.g., backup control nodes) within the grid. For example, the unique identifiers of each of the backup control nodes may be stored in a list of backup control nodes to indicate an order in which the backup control nodes will take over for a failed primary control node to become a new primary control node. However, a hierarchy of nodes may also be determined using methods other than using the unique identifiers of the nodes. For example, the hierarchy may be predetermined, or may be assigned based on other predetermined factors.

The grid may add new machines at any time (e.g., initiated from any control node). Upon adding a new node to the grid, the control node may first add the new node to its table of grid nodes. The control node may also then notify every other control node about the new node. The nodes receiving the notification may acknowledge that they have updated their configuration information.

Primary control node 402 may, for example, transmit one or more communications to backup control nodes 404 and 406 (and, for example, to other control or worker nodes within the communications grid). Such communications may sent periodically, at fixed time intervals, between known fixed stages of the project's execution, among other protocols. The communications transmitted by primary control node 402 may be of varied types and may include a variety of types of information. For example, primary control node 402 may transmit snapshots (e.g., status information) of the communications grid so that backup control node 404 always has a recent snapshot of the communications grid. The snapshot or grid status may include, for example, the structure of the grid (including, for example, the worker nodes in the grid, unique identifiers of the nodes, or their relationships with the primary control node) and the status of a project (including, for example, the status of each worker node's portion of the project). The snapshot may also include analysis or results received from worker nodes in the communications grid. The backup control nodes may receive and store the backup data received from the primary control node. The backup control nodes may transmit a request for such a snapshot (or other information) from the primary control node, or the primary control node may send such information periodically to the backup control nodes.

As noted, the backup data may allow the backup control node to take over as primary control node if the primary control node fails without requiring the grid to start the project over from scratch. If the primary control node fails, the backup control node that will take over as primary control node may retrieve the most recent version of the snapshot received from the primary control node and use the snapshot to continue the project from the stage of the project indicated by the backup data. This may prevent failure of the project as a whole.

A backup control node may use various methods to determine that the primary control node has failed. In one example of such a method, the primary control node may transmit (e.g., periodically) a communication to the backup control node that indicates that the primary control node is working and has not failed, such as a heartbeat communication. The backup control node may determine that the primary control node has failed if the backup control node has not received a heartbeat communication for a certain predetermined period of time. Alternatively, a backup control node may also receive a communication from the primary control node itself (before it failed) or from a worker node that the primary control node has failed, for example because the primary control node has failed to communicate with the worker node.

Different methods may be performed to determine which backup control node of a set of backup control nodes (e.g., backup control nodes 404 and 406) will take over for failed primary control node 402 and become the new primary control node. For example, the new primary control node may be chosen based on a ranking or "hierarchy" of backup control nodes based on their unique identifiers. In an alternative embodiment, a backup control node may be assigned to be the new primary control node by another device in the communications grid or from an external device (e.g., a system infrastructure or an end user, such as a server or computer, controlling the communications grid). In another alternative embodiment, the backup control node that takes over as the new primary control node may be designated based on bandwidth or other statistics about the communications grid.

A worker node within the communications grid may also fail. If a worker node fails, work being performed by the failed worker node may be redistributed amongst the operational worker nodes. In an alternative embodiment, the primary control node may transmit a communication to each of the operable worker nodes still on the communications grid that each of the worker nodes should purposefully fail also. After each of the worker nodes fail, they may each retrieve their most recent saved checkpoint of their status and re-start the project from that checkpoint to minimize lost progress on the project being executed.

Figure 5:
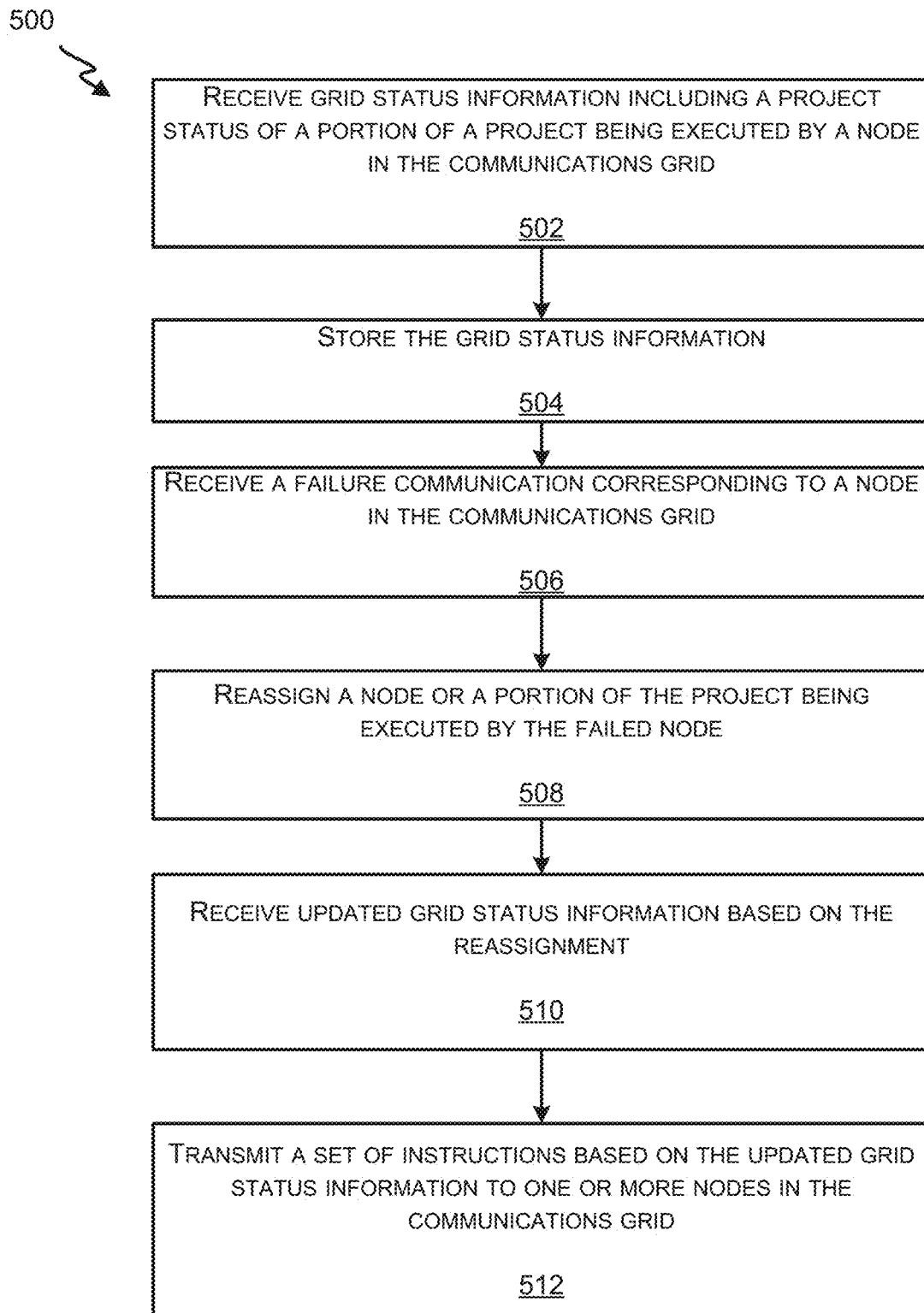
FIG. 5 illustrates a flow chart showing an example process for adjusting a communications grid or a work project in a communications grid after a failure of a node, according to at least one embodiment of the present technology.

FIG. 5 illustrates a flow chart showing an example process for adjusting a communications grid or a work project in a communications grid after a failure of a node, according to embodiments of the present technology. The process may include, for example, receiving grid status information including a project status of a portion of a project being executed by a node in the communications grid, as described in operation 502. For example, a control node (e.g., a backup control node connected to a primary control node and a worker node on a communications grid) may receive grid status information, where the grid status information includes a project status of the primary control node or a project status of the worker node. The project status of the primary control node and the project status of the worker node may include a status of one or more portions of a project being executed by the primary and worker nodes in the communications grid. The process may also include storing the grid status information, as described in operation 504. For example, a control node (e.g., a backup control node) may store the received grid status information locally within the control node. Alternatively, the grid status information may be sent to another device for storage where the control node may have access to the information.

The process may also include receiving a failure communication corresponding to a node in the communications grid in operation 506. For example, a node may receive a failure communication including an indication that the primary control node has failed, prompting a backup control node to take over for the primary control node. In an alternative embodiment, a node may receive a failure that a worker node has failed, prompting a control node to reassign the work being performed by the worker node. The process may also include reassigning a node or a portion of the project being executed by the failed node, as described in operation 508. For example, a control node may designate the backup control node as a new primary control node based on the failure communication upon receiving the failure communication. If the failed node is a worker node, a control node may identify a project status of the failed worker node using the snapshot of the communications grid, where the project status of the failed worker node includes a status of a portion of the project being executed by the failed worker node at the failure time.

The process may also include receiving updated grid status information based on the reassignment, as described in operation 510, and transmitting a set of instructions based on the updated grid status information to one or more nodes in the communications grid, as described in operation 512.

The updated grid status information may include an updated project status of the primary control node or an updated project status of the worker node. The updated information may be transmitted to the other nodes in the grid to update their stale stored information.

Figure 6:
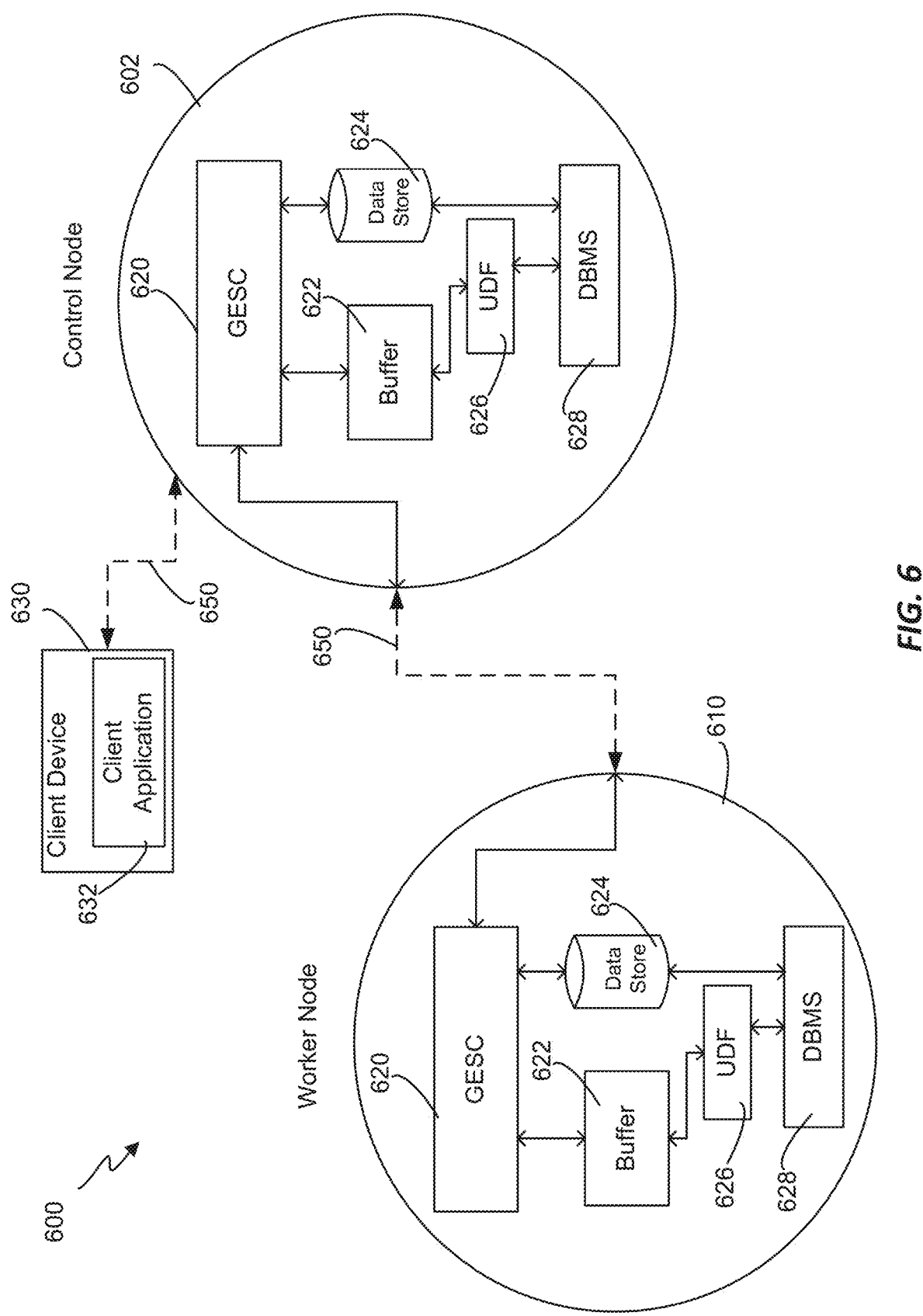
FIG. 6 illustrates a portion of a communications grid computing system including a control node and a worker node, according to at least one embodiment of the present technology.

FIG. 6 illustrates a portion of a communications grid computing system 600 including a control node and a worker node, according to embodiments of the present technology. Communications grid 600 computing system includes one control node (control node 602) and one worker node (worker node 610) for purposes of illustration, but may include more worker and/or control nodes. The control node 602 is communicatively connected to worker node 610 via communication path 650. Therefore, control node 602 may transmit information (e.g., related to the communications grid or notifications), to and receive information from worker node 610 via path 650.

Similar to in FIG. 4, communications grid computing system (or just "communications grid") 600 includes data processing nodes (control node 602 and worker node 610). Nodes 602 and 610 include multi-core data processors. Each node 602 and 610 includes a grid-enabled software component (GESC) 620 that executes on the data processor associated with that node and interfaces with buffer memory 622 also associated with that node. Each node 602 and 610 includes a database management software (DBMS) 628 that executes on a database server (not shown) at control node 602 and on a database server (not shown) at worker node 610.

Each node also includes a data store 624. Data stores 624, similar to network-attached data stores 110 in FIG. 1 and data stores 235 in FIG. 2, are used to store data to be processed by the nodes in the computing environment. Data stores 624 may also store any intermediate or final data generated by the computing system after being processed, for example in non-volatile memory. However in certain embodiments, the configuration of the grid computing environment allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the grid receives queries (e.g., ad hoc) from a client and when responses, which are generated by processing large amounts of data, need to be generated quickly or on-the-fly. In such a situation, the grid may be configured to retain the data within memory so that responses can be generated at different levels of detail and so that a client may interactively query against this information.

Each node also includes a user-defined function (UDF) 626. The UDF provides a mechanism for the DMBS 628 to transfer data to or receive data from the database stored in the data stores 624 that are managed by the DBMS. For example, UDF 626 can be invoked by the DBMS to provide data to the GESC for processing. The UDF 626 may establish a socket connection (not shown) with the GESC to transfer the data. Alternatively, the UDF 626 can transfer data to the GESC by writing data to shared memory accessible by both the UDF and the GESC.

The GESC 620 at the nodes 602 and 620 may be connected via a network, such as network 108 shown in FIG. 1. Therefore, nodes 602 and 620 can communicate with each other via the network using a predetermined communication protocol such as, for example, the Message Passing Interface (MPI). Each GESC 620 can engage in point-to-point communication with the GESC at another node or in collective communication with multiple GESCs via the network. The GESC 620 at each node may contain identical (or nearly identical) software instructions. Each node may be capable of operating as either a control node or a worker node. The GESC at the control node 602 can communicate, over a communication path 652, with a client device 630. More specifically, control node 602 may communicate with client application 632 hosted by the client device 630 to receive queries and to respond to those queries after processing large amounts of data.

DMBS 628 may control the creation, maintenance, and use of database or data structure (not shown) within a nodes 602 or 610. The database may organize data stored in data stores 624. The DMBS 628 at control node 602 may accept requests for data and transfer the appropriate data for the request. With such a process, collections of data may be distributed across multiple physical locations. In this example, each node 602 and 610 stores a portion of the total data managed by the management system in its associated data store 624.

Furthermore, the DBMS may be responsible for protecting against data loss using replication techniques. Replication includes providing a backup copy of data stored on one node on one or more other nodes. Therefore, if one node fails, the data from the failed node can be recovered from a replicated copy residing at another node. However, as described herein with respect to FIG. 4, data or status information for each node in the communications grid may also be shared with each node on the grid.

Figure 7:
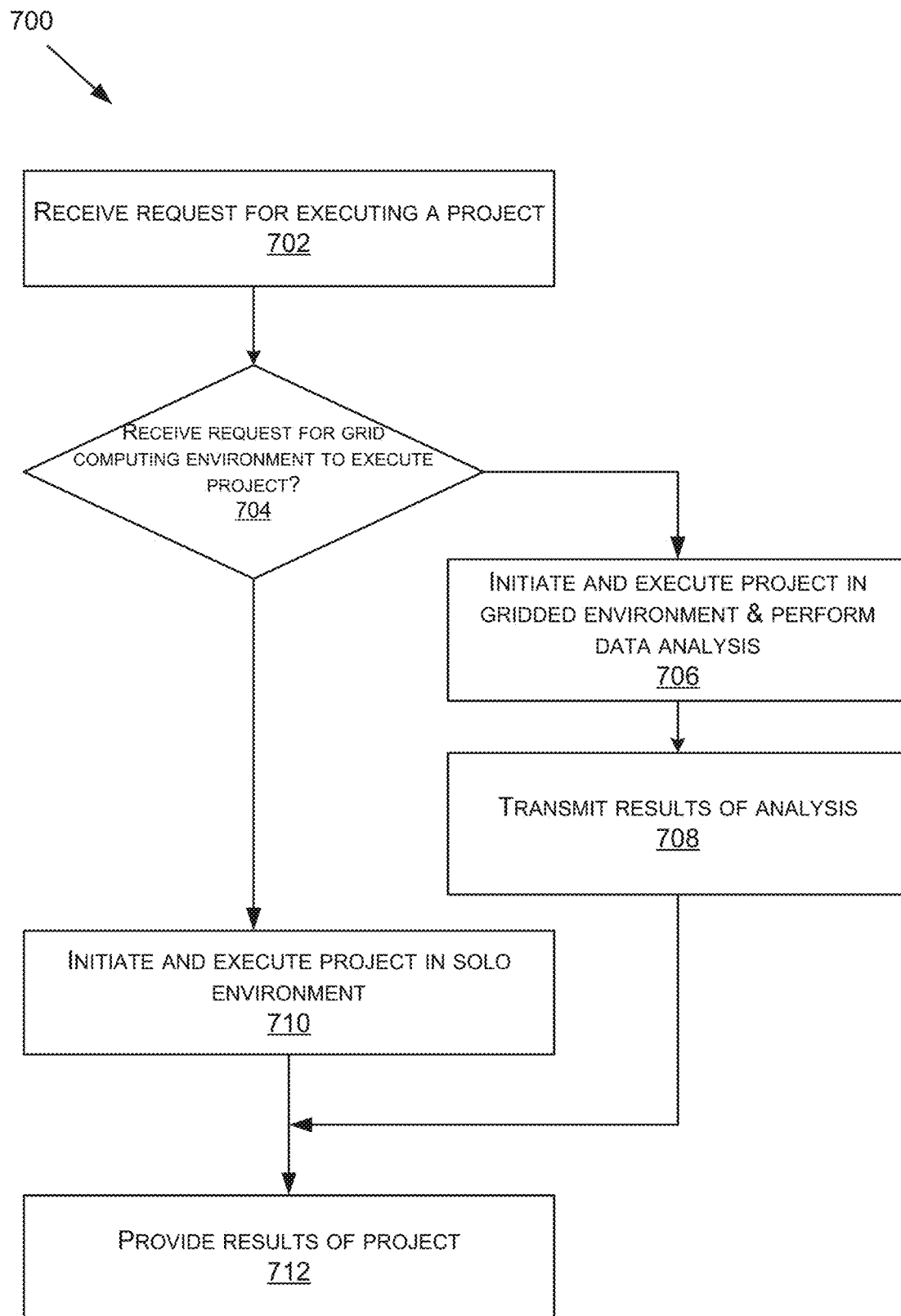
FIG. 7 illustrates a flow chart showing an example process for executing a data analysis or processing project, according to at least one embodiment of the present technology.

FIG. 7 illustrates a flow chart showing an example method for executing a project within a grid computing system, according to embodiments of the present technology. As described with respect to FIG. 6, the GESC at the control node may transmit data with a client device (e.g., client device 630) to receive queries for executing a project and to respond to those queries after large amounts of data have been processed. The query may be transmitted to the control node, where the query may include a request for executing a project, as described in operation 702. The query can contain instructions on the type of data analysis to be performed in the project and whether the project should be executed using the grid-based computing environment, as shown in operation 704.

To initiate the project, the control node may determine if the query requests use of the grid-based computing environment to execute the project. If the determination is no, then the control node initiates execution of the project in a solo environment (e.g., at the control node), as described in operation 710. If the determination is yes, the control node may initiate execution of the project in the grid-based computing environment, as described in operation 706. In such a situation, the request may include a requested configuration of the grid. For example, the request may include a number of control nodes and a number of worker nodes to be used in the grid when executing the project. After the project has been completed, the control node may transmit results of the analysis yielded by the grid, as described in operation 708. Whether the project is executed in a solo or grid-based environment, the control node provides the results of the project.

As noted with respect to FIG. 2, the computing environments described herein may collect data (e.g., as received from network devices, such as sensors, such as network devices 204-209 in FIG. 2, and client devices or other sources) to be processed as part of a data analytics project, and data may be received in real time as part of a streaming analytics environment (e.g., ESP). Data may be collected using a variety of sources as communicated via different kinds of networks or locally, such as on a real-time streaming basis. For example, network devices may receive data periodically from network device sensors as the sensors continuously sense, monitor and track changes in their environments. More specifically, an increasing number of distributed applications develop or produce continuously flowing data from distributed sources by applying queries to the data before distributing the data to geographically distributed recipients. An event stream processing engine (ESPE) may continuously apply the queries to the data as it is received and determines which entities should receive the data. Client or other devices may also subscribe to the ESPE or other devices processing ESP data so that they can receive data after processing, based on for example the entities determined by the processing engine. For example, client devices 230 in FIG. 2 may subscribe to the ESPE in computing environment 214. In another example, event subscription devices 1024a-c, described further with respect to FIG. 10, may also subscribe to the ESPE. The ESPE may determine or define how input data or event streams from network devices or other publishers (e.g., network devices 204-209 in FIG. 2) are transformed into meaningful output data to be consumed by subscribers, such as for example client devices 230 in FIG. 2.

FIG. 8 illustrates a block diagram including components of an Event Stream Processing Engine (ESPE), according to embodiments of the present technology. ESPE 800 may include one or more projects 802. A project may be described as a second-level container in an engine model managed by ESPE 800 where a thread pool size for the project may be defined by a user. Each project of the one or more projects 802 may include one or more continuous queries 804 that contain data flows, which are data transformations of incoming event streams. The one or more continuous queries 804 may include one or more source windows 806 and one or more derived windows 808.

The ESPE may receive streaming data over a period of time related to certain events, such as events or other data sensed by one or more network devices. The ESPE may perform operations associated with processing data created by the one or more devices. For example, the ESPE may receive data from the one or more network devices 204-209 shown in FIG. 2. As noted, the network devices may include sensors that sense different aspects of their environments, and may collect data over time based on those sensed observations. For example, the ESPE may be implemented within one or more of machines 220 and 240 shown in FIG. 2. The ESPE may be implemented within such a machine by an ESP application. An ESP application may embed an ESPE with its own dedicated thread pool or pools into its application space where the main application thread can do application-specific work and the ESPE processes event streams at least by creating an instance of a model into processing objects.

The engine container is the top-level container in a model that manages the resources of the one or more projects 802. In an illustrative embodiment, for example, there may be only one ESPE 800 for each instance of the ESP application, and ESPE 800 may have a unique engine name. Additionally, the one or more projects 802 may each have unique project names, and each query may have a unique continuous query name and begin with a uniquely named source window of the one or more source windows 806. ESPE 800 may or may not be persistent.

Continuous query modeling involves defining directed graphs of windows for event stream manipulation and transformation. A window in the context of event stream manipulation and transformation is a processing node in an event stream processing model. A window in a continuous query can perform aggregations, computations, pattern-matching, and other operations on data flowing through the window. A continuous query may be described as a directed graph of source, relational, pattern matching, and procedural windows. The one or more source windows 806 and the one or more derived windows 808 represent continuously executing queries that generate updates to a query result set as new event blocks stream through ESPE 800. A directed graph, for example, is a set of nodes connected by edges, where the edges have a direction associated with them.

An event object may be described as a packet of data accessible as a collection of fields, with at least one of the fields defined as a key or unique identifier (ID). The event object may be created using a variety of formats including binary, alphanumeric, XML, etc. Each event object may include one or more fields designated as a primary identifier (ID) for the event so ESPE 800 can support operation codes (opcodes) for events including insert, update, upsert, and delete. Upsert opcodes update the event if the key field already exists; otherwise, the event is inserted. For illustration, an event object may be a packed binary representation of a set of field values and include both metadata and field data associated with an event. The metadata may include an opcode indicating if the event represents an insert, update, delete, or upsert, a set of flags indicating if the event is a normal, partial-update, or a retention generated event from retention policy management, and a set of microsecond timestamps that can be used for latency measurements.

An event block object may be described as a grouping or package of event objects. An event stream may be described as a flow of event block objects. A continuous query of the one or more continuous queries 804 transforms a source event stream made up of streaming event block objects published into ESPE 800 into one or more output event streams using the one or more source windows 806 and the one or more derived windows 808. A continuous query can also be thought of as data flow modeling.

The one or more source windows 806 are at the top of the directed graph and have no windows feeding into them. Event streams are published into the one or more source windows 806, and from there, the event streams may be directed to the next set of connected windows as defined by the directed graph. The one or more derived windows 808 are all instantiated windows that are not source windows and that have other windows streaming events into them. The one or more derived windows 808 may perform computations or transformations on the incoming event streams. The one or more derived windows 808 transform event streams based on the window type (that is operators such as join, filter, compute, aggregate, copy, pattern match, procedural, union, etc.) and window settings. As event streams are published into ESPE 800, they are continuously queried, and the resulting sets of derived windows in these queries are continuously updated.

FIG. 9 illustrates a flow chart showing an example process including operations performed by an event stream processing engine, according to some embodiments of the present technology. As noted, the ESPE 800 (or an associated ESP application) defines how input event streams are transformed into meaningful output event streams. More specifically, the ESP application may define how input event streams from publishers (e.g., network devices providing sensed data) are transformed into meaningful output event streams consumed by subscribers (e.g., a data analytics project being executed by a machine or set of machines).

Within the application, a user may interact with one or more user interface windows presented to the user in a display under control of the ESPE independently or through a browser application in an order selectable by the user. For example, a user may execute an ESP application, which causes presentation of a first user interface window, which may include a plurality of menus and selectors such as drop down menus, buttons, text boxes, hyperlinks, etc. associated with the ESP application as understood by a person of skill in the art. As further understood by a person of skill in the art, various operations may be performed in parallel, for example, using a plurality of threads.

At operation 900, an ESP application may define and start an ESPE, thereby instantiating an ESPE at a device, such as machine 220 and/or 240. In an operation 902, the engine container is created. For illustration, ESPE 800 may be instantiated using a function call that specifies the engine container as a manager for the model.

In an operation 904, the one or more continuous queries 804 are instantiated by ESPE 800 as a model. The one or more continuous queries 804 may be instantiated with a dedicated thread pool or pools that generate updates as new events stream through ESPE 800. For illustration, the one or more continuous queries 804 may be created to model business processing logic within ESPE 800, to predict events within ESPE 800, to model a physical system within ESPE 800, to predict the physical system state within ESPE 800, etc. For example, as noted, ESPE 800 may be used to support sensor data monitoring and management (e.g., sensing may include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, or electrical current, etc.).

ESPE 800 may analyze and process events in motion or "event streams." Instead of storing data and running queries against the stored data, ESPE 800 may store queries and stream data through them to allow continuous analysis of data as it is received. The one or more source windows 806 and the one or more derived windows 808 may be created based on the relational, pattern matching, and procedural algorithms that transform the input event streams into the output event streams to model, simulate, score, test, predict, etc. based on the continuous query model defined and application to the streamed data.

In an operation 906, a publish/subscribe (pub/sub) capability is initialized for ESPE 800. In an illustrative embodiment, a pub/sub capability is initialized for each project of the one or more projects 802. To initialize and enable pub/sub capability for ESPE 800, a port number may be provided. Pub/sub clients can use a host name of an ESP device running the ESPE and the port number to establish pub/sub connections to ESPE 800.

FIG. 10 illustrates an ESP system 1000 interfacing between publishing device 1022 and event subscribing devices 1024a-c, according to embodiments of the present technology. ESP system 1000 may include ESP device or subsystem 1001, event publishing device 1022, an event subscribing device A 1024a, an event subscribing device B 1024b, and an event subscribing device C 1024c. Input event streams are output to ESP device 1001 by publishing device 1022. In alternative embodiments, the input event streams may be created by a plurality of publishing devices. The plurality of publishing devices further may publish event streams to other ESP devices. The one or more continuous queries instantiated by ESPE 800 may analyze and process the input event streams to form output event streams output to event subscribing device A 1024a, event subscribing device B 1024b, and event subscribing device C 1024c. ESP system 1000 may include a greater or a fewer number of event subscribing devices of event subscribing devices.

Publish-subscribe is a message-oriented interaction paradigm based on indirect addressing. Processed data recipients specify their interest in receiving information from ESPE 800 by subscribing to specific classes of events, while information sources publish events to ESPE 800 without directly addressing the receiving parties. ESPE 800 coordinates the interactions and processes the data. In some cases, the data source receives confirmation that the published information has been received by a data recipient.

A publish/subscribe API may be described as a library that enables an event publisher, such as publishing device 1022, to publish event streams into ESPE 800 or an event subscriber, such as event subscribing device A 1024a, event subscribing device B 1024b, and event subscribing device C 1024c, to subscribe to event streams from ESPE 800. For illustration, one or more publish/subscribe APIs may be defined. Using the publish/subscribe API, an event publishing application may publish event streams into a running event stream processor project source window of ESPE 800, and the event subscription application may subscribe to an event stream processor project source window of ESPE 800.

The publish/subscribe API provides cross-platform connectivity and endianness compatibility between ESP application and other networked applications, such as event publishing applications instantiated at publishing device 1022, and event subscription applications instantiated at one or more of event subscribing device A 1024a, event subscribing device B 1024b, and event subscribing device C 1024c.

Referring back to FIG. 9, operation 906 initializes the publish/subscribe capability of ESPE 800. In an operation 908, the one or more projects 802 are started. The one or more started projects may run in the background on an ESP device. In an operation 910, an event block object is received from one or more computing device of the event publishing device 1022.

ESP subsystem 800 may include a publishing client 1002, ESPE 800, a subscribing client A 1004, a subscribing client B 1006, and a subscribing client C 1008. Publishing client 1002 may be started by an event publishing application executing at publishing device 1022 using the publish/subscribe API. Subscribing client A 1004 may be started by an event subscription application A, executing at event subscribing device A 1024a using the publish/subscribe API. Subscribing client B 1006 may be started by an event subscription application B executing at event subscribing device B 1024b using the publish/subscribe API. Subscribing client C 1008 may be started by an event subscription application C executing at event subscribing device C 1024c using the publish/subscribe API.

An event block object containing one or more event objects is injected into a source window of the one or more source windows 806 from an instance of an event publishing application on event publishing device 1022. The event block object may be generated, for example, by the event publishing application and may be received by publishing client 1002. A unique ID may be maintained as the event block object is passed between the one or more source windows 806 and/or the one or more derived windows 808 of ESPE 800, and to subscribing client A 1004, subscribing client B 806, and subscribing client C 808 and to event subscription device A 1024a, event subscription device B 1024b, and event subscription device C 1024c. Publishing client 1002 may further generate and include a unique embedded transaction ID in the event block object as the event block object is processed by a continuous query, as well as the unique ID that publishing device 1022 assigned to the event block object.

In an operation 912, the event block object is processed through the one or more continuous queries 804. In an operation 914, the processed event block object is output to one or more computing devices of the event subscribing devices 1024a-c. For example, subscribing client A 804, subscribing client B 806, and subscribing client C 808 may send the received event block object to event subscription device A 1024a, event subscription device B 1024b, and event subscription device C 1024c, respectively.

ESPE 800 maintains the event block containership aspect of the received event blocks from when the event block is published into a source window and works its way through the directed graph defined by the one or more continuous queries 804 with the various event translations before being output to subscribers. Subscribers can correlate a group of subscribed events back to a group of published events by comparing the unique ID of the event block object that a publisher, such as publishing device 1022, attached to the event block object with the event block ID received by the subscriber.

In an operation 916, a determination is made concerning whether or not processing is stopped. If processing is not stopped, processing continues in operation 910 to continue receiving the one or more event streams containing event block objects from the, for example, one or more network devices. If processing is stopped, processing continues in an operation 918. In operation 918, the started projects are stopped. In operation 920, the ESPE is shutdown.

As noted, in some embodiments, big data is processed for an analytics project after the data is received and stored. In other embodiments, distributed applications process continuously flowing data in real-time from distributed sources by applying queries to the data before distributing the data to geographically distributed recipients. As noted, an event stream processing engine (ESPE) may continuously apply the queries to the data as it is received and determines which entities receive the processed data. This allows for large amounts of data being received and/or collected in a variety of environments to be processed and distributed in real time. For example, as shown with respect to FIG. 2, data may be collected from network devices that may include devices within the internet of things, such as devices within a home automation network. However, such data may be collected from a variety of different resources in a variety of different environments. In any such situation, embodiments of the present technology allow for real-time processing of such data.

Aspects of the current disclosure provide technical solutions to technical problems, such as computing problems that arise when an ESP device fails which results in a complete service interruption and potentially significant data loss. The data loss can be catastrophic when the streamed data is supporting mission critical operations such as those in support of an ongoing manufacturing or drilling operation. An embodiment of an ESP system achieves a rapid and seamless failover of ESPE running at the plurality of ESP devices without service interruption or data loss, thus significantly improving the reliability of an operational system that relies on the live or real-time processing of the data streams. The event publishing systems, the event subscribing systems, and each ESPE not executing at a failed ESP device are not aware of or effected by the failed ESP device. The ESP system may include thousands of event publishing systems and event subscribing systems. The ESP system keeps the failover logic and awareness within the boundaries of out-messaging network connector and out-messaging network device.

In one example embodiment, a system is provided to support a failover when event stream processing (ESP) event blocks. The system includes, but is not limited to, an out-messaging network device and a computing device. The computing device includes, but is not limited to, a processor and a computer-readable medium operably coupled to the processor. The processor is configured to execute an ESP engine (ESPE). The computer-readable medium has instructions stored thereon that, when executed by the processor, cause the computing device to support the failover. An event block object is received from the ESPE that includes a unique identifier. A first status of the computing device as active or standby is determined. When the first status is active, a second status of the computing device as newly active or not newly active is determined. Newly active is determined when the computing device is switched from a standby status to an active status. When the second status is newly active, a last published event block object identifier that uniquely identifies a last published event block object is determined. A next event block object is selected from a non-transitory computer-readable medium accessible by the computing device. The next event block object has an event block object identifier that is greater than the determined last published event block object identifier. The selected next event block object is published to an out-messaging network device. When the second status of the computing device is not newly active, the received event block object is published to the out-messaging network device. When the first status of the computing device is standby, the received event block object is stored in the non-transitory computer-readable medium.

Figure 11:
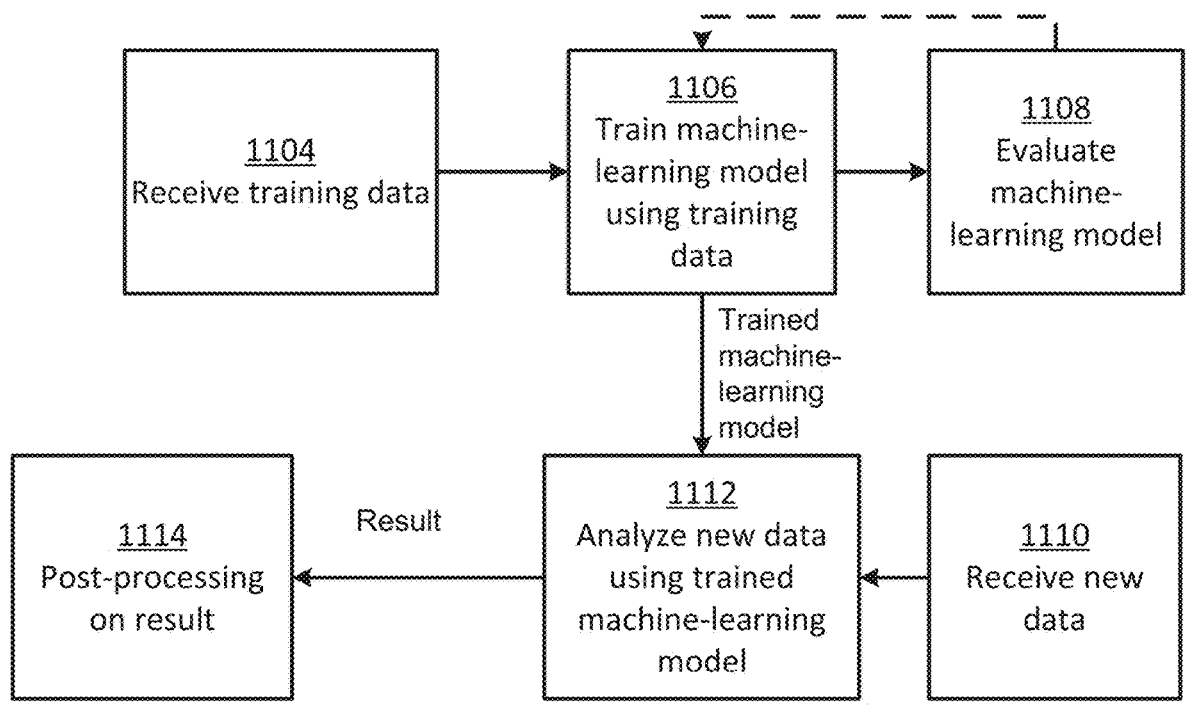
FIG. 11 illustrates a flow chart of an example of a process for generating and using a machine-learning model according to at least one embodiment of the present technology.

FIG. 11 is a flow chart of an example of a process for generating and using a machine-learning model according to some aspects. Machine learning is a branch of artificial intelligence that relates to mathematical models that can learn from, categorize, and make predictions about data. Such mathematical models, which can be referred to as machine-learning models, can classify input data among two or more classes; cluster input data among two or more groups; predict a result based on input data; identify patterns or trends in input data; identify a distribution of input data in a space; or any combination of these. Examples of machine-learning models can include (i) neural networks; (ii) decision trees, such as classification trees and regression trees; (iii) classifiers, such as Naïve bias classifiers, logistic regression classifiers, ridge regression classifiers, random forest classifiers, least absolute shrinkage and selector (LASSO) classifiers, and support vector machines; (iv) clusterers, such as k-means clusterers, mean-shift clusterers, and spectral clusterers; (v) factorizers, such as factorization machines, principal component analyzers and kernel principal component analyzers; and (vi) ensembles or other combinations of machine-learning models. In some examples, neural networks can include deep neural networks, feed-forward neural networks, recurrent neural networks, convolutional neural networks, radial basis function (RBF) neural networks, echo state neural networks, long short-term memory neural networks, bi-directional recurrent neural networks, gated neural networks, hierarchical recurrent neural networks, stochastic neural networks, modular neural networks, spiking neural networks, dynamic neural networks, cascading neural networks, neuro-fuzzy neural networks, or any combination of these.

Different machine-learning models may be used interchangeably to perform a task. Examples of tasks that can be performed at least partially using machine-learning models include various types of scoring; bioinformatics; cheminformatics; software engineering; fraud detection; customer segmentation; generating online recommendations; adaptive websites; determining customer lifetime value; search engines; placing advertisements in real time or near real time; classifying DNA sequences; affective computing; performing natural language processing and understanding; object recognition and computer vision; robotic locomotion; playing games; optimization and metaheuristics; detecting network intrusions; medical diagnosis and monitoring; or predicting when an asset, such as a machine, will need maintenance.

Any number and combination of tools can be used to create machine-learning models. Examples of tools for creating and managing machine-learning models can include SAS® Enterprise Miner, SAS® Rapid Predictive Modeler, and SAS® Model Manager, SAS Cloud Analytic Services (CAS)®, SAS Viya® of all which are by SAS Institute Inc. of Cary, N.C.

Machine-learning models can be constructed through an at least partially automated (e.g., with little or no human involvement) process called training. During training, input data can be iteratively supplied to a machine-learning model to enable the machine-learning model to identify patterns related to the input data or to identify relationships between the input data and output data. With training, the machine-learning model can be transformed from an untrained state to a trained state. Input data can be split into one or more training sets and one or more validation sets, and the training process may be repeated multiple times. The splitting may follow a k-fold cross-validation rule, a leave-one-out-rule, a leave-p-out rule, or a holdout rule. An overview of training and using a machine-learning model is described below with respect to the flow chart of FIG. 11.

In block 1104, training data is received. In some examples, the training data is received from a remote database or a local database, constructed from various subsets of data, or input by a user. The training data can be used in its raw form for training a machine-learning model or pre-processed into another form, which can then be used for training the machine-learning model. For example, the raw form of the training data can be smoothed, truncated, aggregated, clustered, or otherwise manipulated into another form, which can then be used for training the machine-learning model.

In block 1106, a machine-learning model is trained using the training data. The machine-learning model can be trained in a supervised, unsupervised, or semi-supervised manner. In supervised training, each input in the training data is correlated to a desired output. This desired output may be a scalar, a vector, or a different type of data structure such as text or an image. This may enable the machine-learning model to learn a mapping between the inputs and desired outputs. In unsupervised training, the training data includes inputs, but not desired outputs, so that the machine-learning model has to find structure in the inputs on its own. In semi-supervised training, only some of the inputs in the training data are correlated to desired outputs.

In block 1108, the machine-learning model is evaluated. For example, an evaluation dataset can be obtained, for example, via user input or from a database. The evaluation dataset can include inputs correlated to desired outputs. The inputs can be provided to the machine-learning model and the outputs from the machine-learning model can be compared to the desired outputs. If the outputs from the machine-learning model closely correspond with the desired outputs, the machine-learning model may have a high degree of accuracy. For example, if 90% or more of the outputs from the machine-learning model are the same as the desired outputs in the evaluation dataset, the machine-learning model may have a high degree of accuracy. Otherwise, the machine-learning model may have a low degree of accuracy. The 90% number is an example only. A realistic and desirable accuracy percentage is dependent on the problem and the data.

In some examples, if the machine-learning model has an inadequate degree of accuracy for a particular task, the process can return to block 1106, where the machine-learning model can be further trained using additional training data or otherwise modified to improve accuracy. If the machine-learning model has an adequate degree of accuracy for the particular task, the process can continue to block 1110.

In block 1110, new data is received. In some examples, the new data is received from a remote database or a local database, constructed from various subsets of data, or input by a user. The new data may be unknown to the machine-learning model. For example, the machine-learning model may not have previously processed or analyzed the new data.

In block 1112, the trained machine-learning model is used to analyze the new data and provide a result. For example, the new data can be provided as input to the trained machine-learning model. The trained machine-learning model can analyze the new data and provide a result that includes a classification of the new data into a particular class, a clustering of the new data into a particular group, a prediction based on the new data, or any combination of these.

In block 1114, the result is post-processed. For example, the result can be added to, multiplied with, or otherwise combined with other data as part of a job. As another example, the result can be transformed from a first format, such as a time series format, into another format, such as a count series format. Any number and combination of operations can be performed on the result during post-processing.

Figure 12:
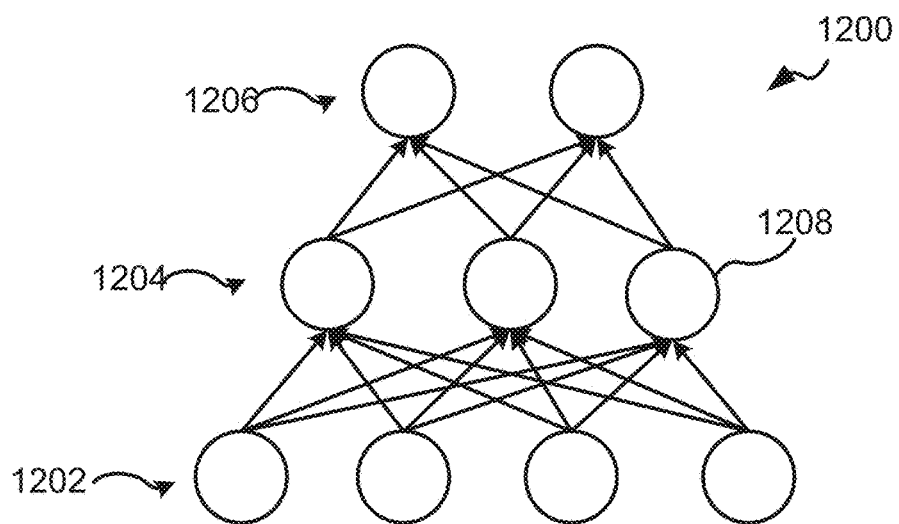
FIG. 12 illustrates an example of a machine-learning model as a neural network.

A more specific example of a machine-learning model is the neural network 1200 shown in FIG. 12. The neural network 1200 is represented as multiple layers of interconnected neurons, such as neuron 1208, that can exchange data between one another. The layers include an input layer 1202 for receiving input data, a hidden layer 1204, and an output layer 1206 for providing a result. The hidden layer 1204 is referred to as hidden because it may not be directly observable or have its input directly accessible during the normal functioning of the neural network 1200. Although the neural network 1200 is shown as having a specific number of layers and neurons for exemplary purposes, the neural network 1200 can have any number and combination of layers, and each layer can have any number and combination of neurons.

The neurons and connections between the neurons can have numeric weights, which can be tuned during training. For example, training data can be provided to the input layer 1202 of the neural network 1200, and the neural network 1200 can use the training data to tune one or more numeric weights of the neural network 1200. In some examples, the neural network 1200 can be trained using backpropagation.

Backpropagation can include determining a gradient of a particular numeric weight based on a difference between an actual output of the neural network 1200 and a desired output of the neural network 1200. Based on the gradient, one or more numeric weights of the neural network 1200 can be updated to reduce the difference, thereby increasing the accuracy of the neural network 1200. This process can be repeated multiple times to train the neural network 1200. For example, this process can be repeated hundreds or thousands of times to train the neural network 1200.

In some examples, the neural network 1200 is a feed-forward neural network. In a feed-forward neural network, every neuron only propagates an output value to a subsequent layer of the neural network 1200. For example, data may only move one direction (forward) from one neuron to the next neuron in a feed-forward neural network.

In other examples, the neural network 1200 is a recurrent neural network. A recurrent neural network can include one or more feedback loops, allowing data to propagate in both forward and backward through the neural network 1200. This can allow for information to persist within the recurrent neural network. For example, a recurrent neural network can determine an output based at least partially on information that the recurrent neural network has seen before, giving the recurrent neural network the ability to use previous input to inform the output.

In some examples, the neural network 1200 operates by receiving a vector of numbers from one layer; transforming the vector of numbers into a new vector of numbers using a matrix of numeric weights, a nonlinearity, or both; and providing the new vector of numbers to a subsequent layer of the neural network 1200. Each subsequent layer of the neural network 1200 can repeat this process until the neural network 1200 outputs a final result at the output layer 1206. For example, the neural network 1200 can receive a vector of numbers as an input at the input layer 1202. The neural network 1200 can multiply the vector of numbers by a matrix of numeric weights to determine a weighted vector. The matrix of numeric weights can be tuned during the training of the neural network 1200. The neural network 1200 can transform the weighted vector using a nonlinearity, such as a sigmoid tangent or the hyperbolic tangent. In some examples, the nonlinearity can include a rectified linear unit, which can be expressed using the following equation:

$$y = \max(x, 0)$$

where y is the output and x is an input value from the weighted vector. The transformed output can be supplied to a subsequent layer, such as the hidden layer 1204, of the neural network 1200. The subsequent layer of the neural network 1200 can receive the transformed output, multiply the transformed output by a matrix of numeric weights and a nonlinearity, and provide the result to yet another layer of the neural network 1200. This process continues until the neural network 1200 outputs a final result at the output layer 1206.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices, such as the communications grid computing system 400 discussed above.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network to analyze the data using fewer processing cycles and less memory than other approaches, while obtaining a similar or greater level of accuracy.

Some machine-learning approaches may be more efficiently and speedily executed and processed with machine-learning specific processors (e.g., not a generic CPU). Such processors may also provide an energy savings when compared to generic CPUs. For example, some of these processors can include a graphical processing unit (GPU), an application-specific integrated circuit (ASIC), a field-programmable gate array (FPGA), an artificial intelligence (AI) accelerator, a neural computing core, a neural computing engine, a neural processing unit, a purpose-built chip architecture for deep learning, and/or some other machine-learning specific processor that implements a machine learning approach or one or more neural networks using semiconductor (e.g., silicon (Si), gallium arsenide (GaAs)) devices. Furthermore, these processors may also be employed in heterogeneous computing architectures with a number of and a variety of different types of cores, engines, nodes, and/or layers to achieve various energy efficiencies, processing speed improvements, data communication speed improvements, and/or data efficiency targets and improvements throughout various parts of the system when compared to a homogeneous computing architecture that employs CPUs for general purpose computing.

Supersaturated designs for experiments are presently underused or avoided by experimenters and are difficult to implement due to properties of the designs and its ability to correctly determine the active factors. Currently supersaturated designs must be constructed. For instance, Jones et al. have prepared a paper on approaches for constructing supersaturated designs. Bradley Jones, Ryan Lekivetz, Dibyen Majumdar, Christopher J. Nachtsheim & Jonathan W. Stallrich (2019): Construction, Properties, and Analysis of Group-Orthogonal Supersaturated Designs, Technometrics. Pre-construction and storage in a catalog would be data intensive in situations where there may be thousands of runs or factors possible. Even if pre-constructed and stored in a catalog, a user would need to determine values for parameters about the supersaturated design to either construct or identify a supersaturated design (e.g., parameters comprising the number of factors, groups for the factors, or test cases in the design of the experiment). Not all values are possible in constructing a supersaturated design (e.g., a group-orthogonal supersaturated design).

A practitioner may have a fixed budget in terms of the number of test cases or runs, but not know how many factors or parameters that an optimal group-orthogonal supersaturated design can accommodate. Alternatively, a practitioner may know how many factors they want to investigate, but not know how many runs their design will need for an optimal supersaturated design. One or more embodiments (e.g., system 1300), are useful for outputting an indication of a supersaturated design with incomplete information regarding this design.

Figure 13:
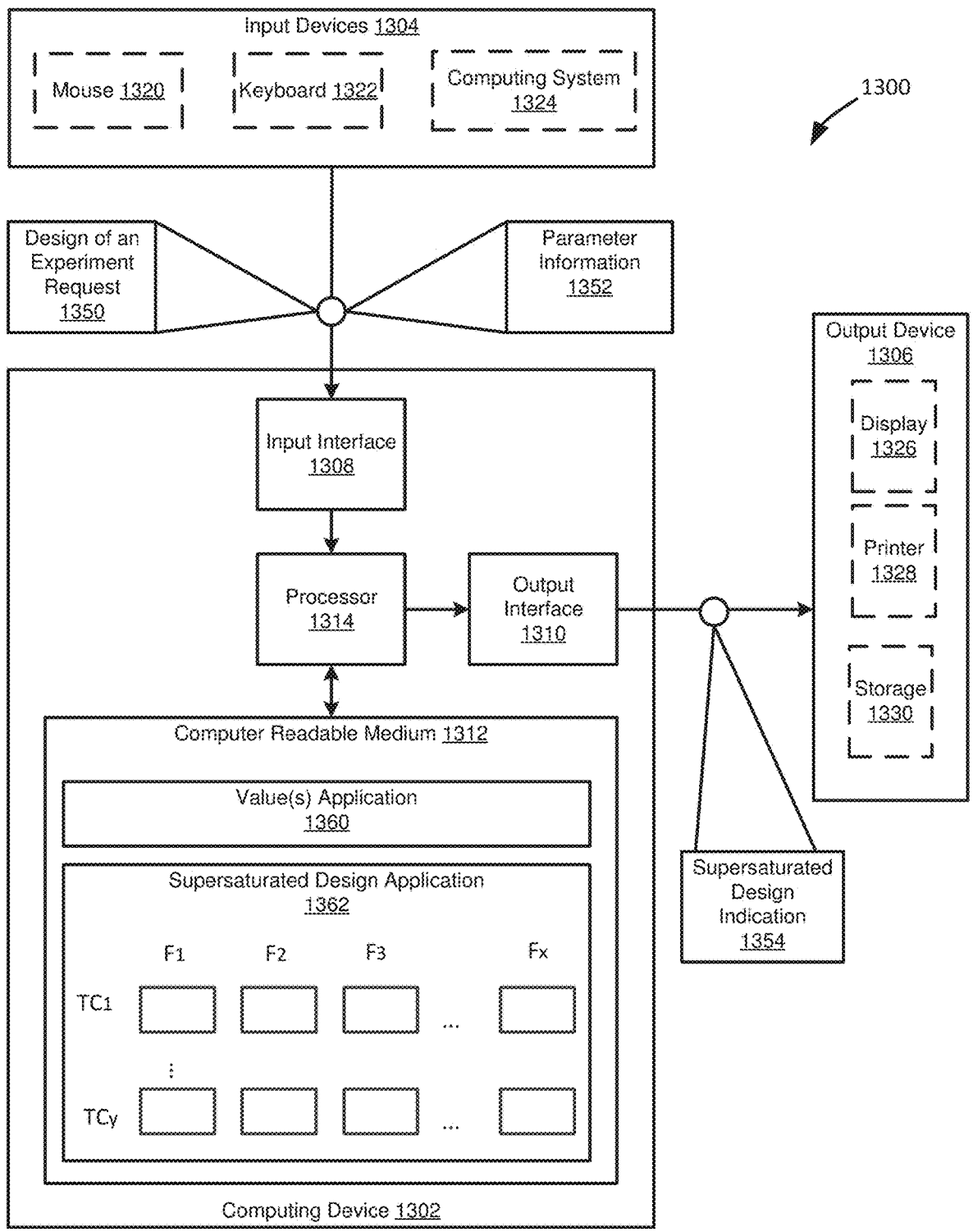
FIG. 13 illustrates a block diagram of a system for outputting an indication of a supersaturated design in at least one embodiment of the present technology.

FIG. 13 illustrates a block diagram of a system 1300 for outputting an indication 1354 of a supersaturated design. The system 1300 includes one or more devices (e.g., a computing device 1302, input devices 1304, and an output device 1306). For instance, the system 1300 can exchange information between the computing device 1302 and input devices 1304 and between the computing device 1302 and output device 1306 (e.g., via wired and/or wireless transmission). For example, a network (not shown) can connect one or more devices of system 1300 to one or more other devices of system 1300.

Computing device 1302 includes an input interface 1308, an output interface 1310, a computer readable medium 1312, and a processor 1314. In other embodiments, fewer, different, and additional components can be incorporated into computing device 1302.

The computing device 1302 can receive information or requests from one or more input devices 1304 via input interface 1308. For instance, as shown in FIG. 13 the information received by input interface 1308 may include a request 1350 for a design of an experiment. For example, the design may be a request to design an experiment to test combinations of settings or conditions that may lead to an outcome of a machine or system (e.g., a failure of an airplane or computing system). In this case, the design of the experiment may have multiple test cases with each test case of the multiple test cases comprises multiple test conditions for testing one of different factors for the experiment (e.g., different components or environments for the machine or system). A test condition of the multiple test conditions comprises one of different options for a given factor in the design of the experiment. For example, if the factor was an environmental factor for an airplane experiment, one factor may be an altitude or speed for the airplane to fly at or to simulate an airplane flying at. The factor could be a continuous factor and the options would be continuous within one or more ranges (e.g., a range of speeds). The factor could be discrete, and the options could be nominal discrete options (e.g., 460 mph, 575 mph). As another example, if the factor were a component factor for an airplane experiment, one factor may be a categorical factor (e.g., a type of engine) and the options could be discrete options within the category of a type of engine (e.g., a gas turbine engine or a piston engine).

In one or more embodiments, the computing device 1302 also receives one or more inputs or parameters for indicating a type of design for the experiment (e.g., a supersaturated design or group-orthogonal supersaturated design). These parameters may be specifications for the type of design for the experiment. For example, one or more parameters of multiple parameters for the design of the experiment could include or indicate a total number of the plurality of test cases for the design of the experiment, a total number of the different factors for the design of the experiment and/or a total number of different groups for grouping factors of the different factors.

For example, the computing device 1302 can receive parameter information 1352 from the same or different input devices 1304 as it received request 1350. For instance, the computing device 1302 may receive a value for a parameter of multiple parameters for the design of the experiment (e.g., a value indicating 8 total test cases). The parameter information 1352 may be received with or separately from the request 1350. In one or more embodiments, the computing device 1302 stores default values for parameters (e.g., stored in computer readable medium 1312) and the computing device 1302 receives a value for a parameter by receiving a user indication to select or use the default value. More than one value for a parameter may be received and/or respective values for more than one parameter of the multiple parameters may be received.

In one or more embodiments, input devices 1304 comprise one or more devices for user entry (e.g., entry of value for a parameter) into the system 1300. For instance, the input device 1304 could include one or more of a mouse 1320 or a keyboard 1322. Alternatively, or additionally, the input device 1304 includes a display, a track ball, a keypad, one or more buttons, a sensor, a phone, etc. Input interface 1308 in the same or different embodiments further provides an interface for receiving information from another device or machine such as a computing system 1324.

The computing device 1302 outputs information to output device 1306 via output interface 1310. Output interface 1310 provides an interface for outputting information (e.g., information representing a supersaturated design indication 1354) for review by a user and/or for use by another application or device or multiple applications or devices. For example, output interface 1310 interfaces with various output technologies including, but not limited to, display device 1326 and a printer 1328. In the same or different embodiments, output interface 1310 interfaces with a data storage device 1330 for data storage of output information.

In an alternative embodiment, the same interface supports both input interface 1308 and output interface 1310. For example, a touch screen provides a mechanism for user input and for presentation of output to the user. Alternatively, the input interface 1308 has more than one input interface that uses the same or different interface technology. Alternatively, or additionally, the output interface 1310 has more than one output interface that uses the same or different interface technology.

In one or more embodiments, the system 1300 is useful for outputting to output device 1306 an indication 1354 of a supersaturated design. In some embodiments, the output device 1306 may be one or more of a display device 1326, a printer 1328, a data storage device 1330 or another device not shown. For example, the indication 1354 of the supersaturated design may be the design itself displayed on a display device (e.g., a generated test condition for each element of a test case of the design of the experiment). Additionally, or alternatively, the indication 1354 may be an indication of parameters of the design (e.g., for selection of the supersaturated design or generation of the design). Additionally, or alternatively, the indication 1354 may describe one or more properties or features of the design, factors, or test cases of the design (e.g., correlation information between factors according to the supersaturated design).

Computer readable medium 1312 is an electronic holding place or storage for information so the information can be accessed by processor. Computer readable medium 1312 can include, but is not limited to, any type of random access memory (RAM), any type of read only memory (ROM), any type of flash memory, etc. such as magnetic storage devices (e.g., hard disk, floppy disk, magnetic strips), optical disks (e.g., compact disc (CD), digital versatile disc (DVD)), smart cards, flash memory devices, etc.

Processor 1314 executes instructions (e.g., stored at the computer readable medium 1312 for generating the indication). The instructions can be carried out by a special purpose computer, logic circuits, or hardware circuits. In one or more embodiments, processor 1314 is implemented in hardware and/or firmware. Processor 1314 executes an instruction, meaning it performs or controls the operations called for by that instruction. The term "execution" is the process of running an application or the carrying out of the operation called for by an instruction. The instructions can be written using one or more programming language, scripting language, assembly language, etc. Processor 1314 operably couples with input interface 1308, with output interface 1310 and with computer readable medium 1312 to receive, to send, and to process information. Processor 1314 in one or more embodiments can retrieve a set of instructions from a permanent memory device and copy the instructions in an executable form to a temporary memory device that is generally some form of RAM.

In one or more embodiments, computer readable medium 1312 stores instructions for execution by processor 1314. For example, computer readable medium 1312 could comprise instructions for a value(s) application 1360 for generating respective value(s) for each of one or more parameters for the design of an experiment. Additionally, or alternatively, the computer readable medium comprises instructions for a supersaturated design application 1362 for generating a supersaturated design for the experiment.

For example, in one or more embodiments, the computing device 1302 generates a respective value for each of one or more other parameters of the multiple parameters such that the design of the experiment according to the multiple parameters is a supersaturated design. In the supersaturated design the total number factors (e.g., $F_1 \ldots F_x$) is greater than the total number of test cases in the design (e.g., $TC_1 \ldots TC_y$). The generated respective values can be generated for parameters different than parameters in which values were received. In other words, the computing device 1302 can determine missing values needed in order to generate a supersaturated design.

In the same or different embodiment, the computing device can generate a supersaturated design (e.g., based on values received by computing device 1302 for parameters and/or based on generated values for parameters). In one or more embodiments, the generated supersaturated design for the design of the experiment is a design that distributes each of the different factors into one of different groups. For example, the supersaturated design may be a group-orthogonal supersaturated design in which the groups are designed to be orthogonal to one another or optimal in some way. Factors (e.g., represented in columns) in the design may be partitioned into groups such that the factors/columns within a group are correlated to the others within the same group, but are orthogonal to any factor/column in any other group.

For example, the supersaturated design application 1362 may have different stored combinations of values (e.g., of runs or factors for the experiment) that would yield a group-orthogonal supersaturated design or GO-SSD. The computing device 1302 can be used to let the user specify, for example, either the number of runs of the number of factors. These combinations can be used to suggest values for unspecified parameters (e.g., to present to a user). Selected combinations can then be used to compute or construct a group-orthogonal supersaturated (e.g., without using a constructed design catalog).

In one or more embodiments, one or more applications stored on computer readable medium 1312 are implemented in software (e.g., computer readable and/or computer-executable instructions) stored in computer readable medium 1312 and accessible by processor 1314 for execution of the instructions. The applications can be written using one or more programming languages, assembly languages, scripting languages, etc. The one or more application can be integrated with other analytic tools. In one example, a value(s) application 1360 and a supersaturated design application 1362 are integrated with data analytics software application and/or software architecture such as that offered by SAS Institute Inc. of Cary, N.C., USA. Merely for illustration, the applications are implemented using or integrated with one or more SAS software tools such as JMP®, Base SAS, SAS® Enterprise Miner™, SAS/STAT®, SAS® High Performance Analytics Server, SAS® Visual Data Mining and Machine Learning, SAS® LASR™ SAS® In-Database Products, SAS® Scalable Performance Data Engine, SAS® Cloud Analytic Services, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, and SAS/IML® all of which are developed and provided by SAS Institute Inc. of Cary, N.C., USA.

Figure 14:
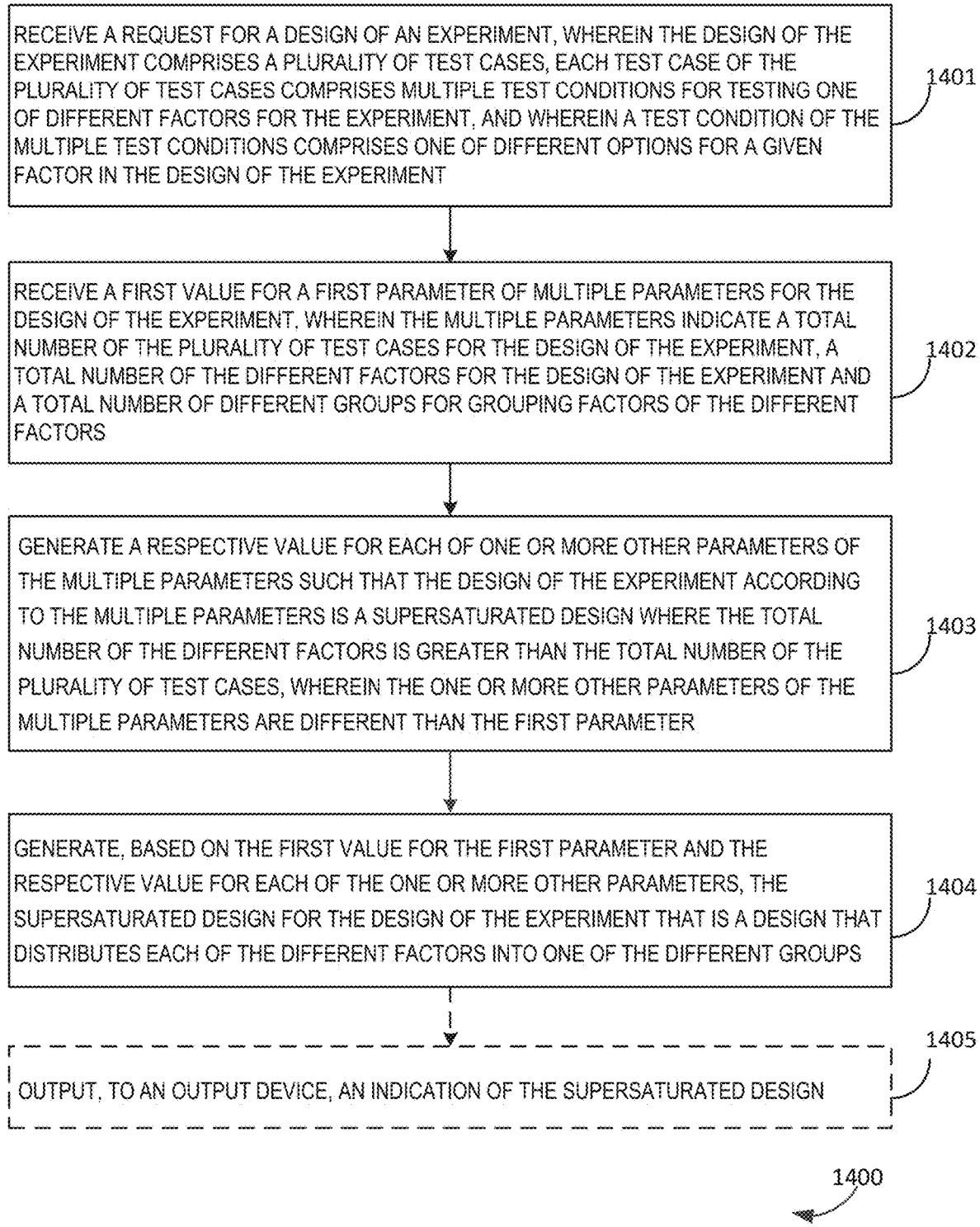
FIG. 14 illustrates a flow diagram for outputting an indication of a supersaturated design in at least one embodiment of the present technology.
Figure 22A:
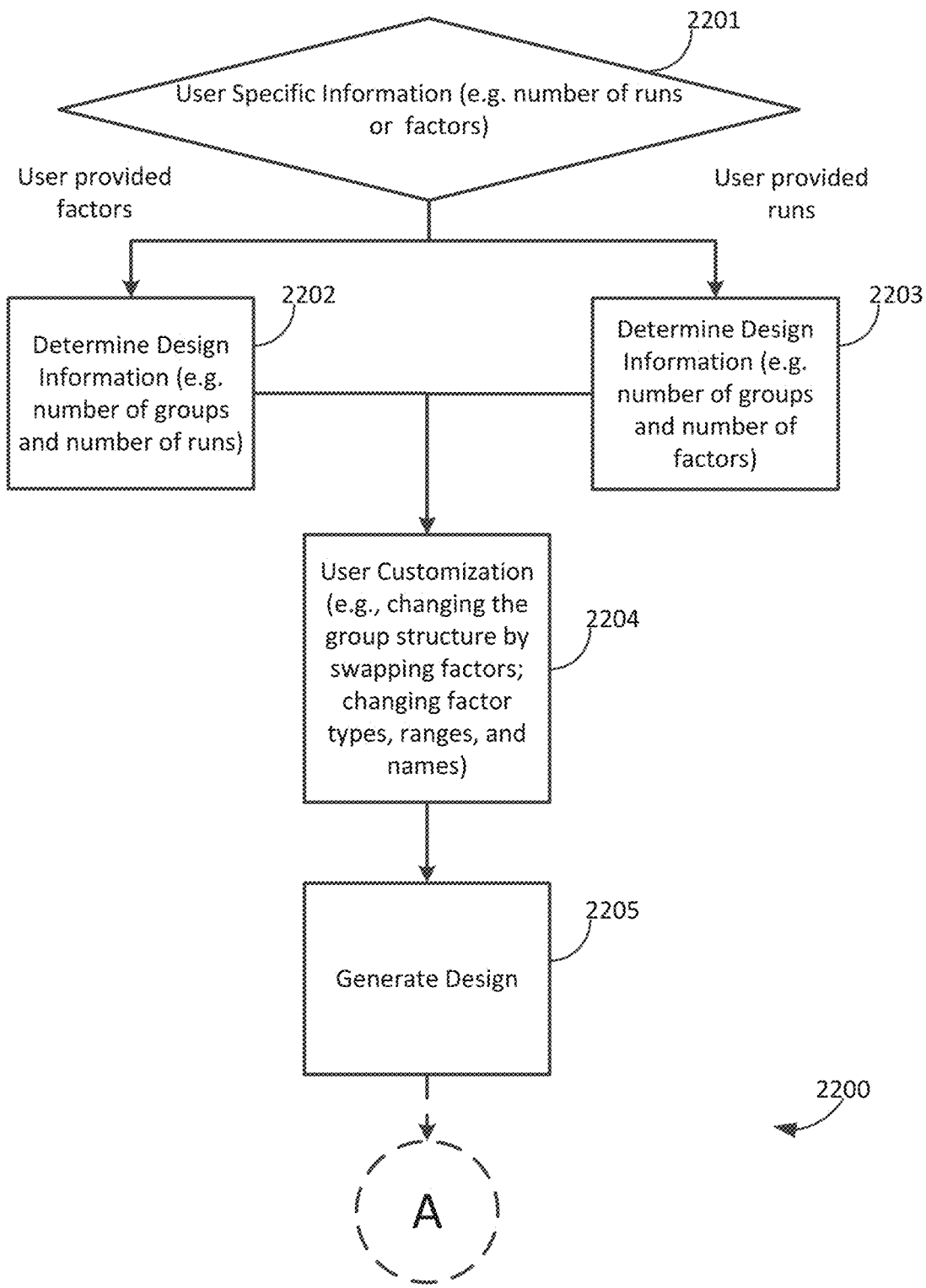
FIG. 22A illustrates a flow diagram for generating a supersaturated design in at least one embodiment of the present technology.

In one or more embodiments, the system 1300 implements a method as described herein (e.g., a method shown in FIGS. 14 and 22A-22B).

FIG. 14 illustrates a flow diagram for a method 1400 of outputting an indication of a supersaturated design.

An operation 1401 of method 1400 comprises receiving a request for a design of an experiment. For instance, the design of the experiment comprises a plurality of test cases. Each test case of the plurality of test cases comprises multiple test conditions for testing one of different factors for the experiment. A test condition of the multiple test conditions comprises one of different options for a given factor in the design of the experiment.

An operation 1402 of method 1400 comprises receiving a first value for a first parameter of multiple parameters for the design of the experiment. The multiple parameters indicate a total number of the plurality of test cases for the design of the experiment, a total number of the different factors for the design of the experiment and a total number of different groups for grouping factors of the different factors. For example, the operation 1402 could comprise receiving the first value by receiving input indicating the total number of the plurality of test cases for the design of the experiment.

Operations 1401 and 1402 could be performed in any order or simultaneously.

An operation 1403 of method 1400 comprises generating a respective value for each of one or more other parameters of the multiple parameters such that the design of the experiment according to the multiple parameters is a supersaturated design where the total number of the different factors is greater than the total number of the plurality of test cases. The one or more other parameters of the multiple parameters are different than the first parameter. For example, options could be presented for parameters such that each of different groups could comprise a same number of factors, and the total number of (unspecified) factors is a power of 2.

In one or more embodiments, the operation 1403 comprises generating multiple options indicating different possible values for each of the one or more other parameters of the multiple parameters. These options may be ones that would allow generation of a complete group-orthogonal supersaturated design. For example, in a case where a computing device has received a selection of a number of test cases, a computing device could generate options indicating different total numbers of the different factors for the design of the experiment and the total number of different groups for the different factors. The multiple options could be displayed (e.g., on an output device 1306 for displaying a graphical user interface shown in FIG. 15B or FIG. 21). A user could then select one of the multiple options.

An operation 1404 of method 1400 comprises generating, based on the first value for the first parameter and the respective value for each of the one or more other parameters, the supersaturated design for the design of the experiment that is a design that distributes each of the different factors into one of the different groups. For example, generating the supersaturated design could be based on a received value for a parameter and based on selected generated parameters.

In one or more embodiments, a supersaturated design is constructed based on a Kronecker product of generated matrices. For example, in one or more embodiments, a computing device selects a respective order for each of one or more Hadamard matrices based on received values and generated values parameters of multiple parameters; and computes, based on the respective order, the one or more Hadamard matrices.

An operation 1405 of method 1400 comprises optionally outputting, to an output device, an indication of the supersaturated design.

Figure 17:
FIG. 17 illustrates a portion of a generated supersaturated design in at least one embodiment of the present technology.

For example, after the specifications of the parameters are set to the user's liking, the Make Design button 1551 can be used to trigger generation and display of a design (e.g. a design shown in FIG. 17).

FIGS. 15A-B illustrate graphical user interfaces for generating a supersaturated design (e.g., in accordance with the method 1400).

FIG. 15A illustrates an example graphical user interface 1500 for generating a supersaturated design. As shown in FIG. 15A a text box 1501 can be used to input a value for a first parameter of multiple parameters for the design of the experiment. In this case, the first parameter indicates the total number of test cases (or runs) for the design of the experiment and the user has selected 12 runs. Entry of a value for any one of the multiple parameters could be displayed in the graphical user interface. For example, graphical user interface 1500 shows a text box 1502 for entering a number of factors 1500. Other parameters are possible (e.g., text box 1504). By selecting one of the parameters to enter a value, the other options for entering a value for a parameter could become inoperable to the user. For example, text box 1502 could be grayed out to prevent entry in the box. This could indicate the computing device has enough parameters to suggest a design. The suggest design button 1503 could be used to generate a request for a design of an experiment. Alternatively, inputting the value in the text box 1501 could trigger the request.

In one or more embodiments, the graphical user interface 1550 is part of the graphical user interface 1500 or is a separate interface. In the example shown in FIG. 15A, the user has specified a quantity of runs in the graphical user interface 1550. The user is presented with possible design choices in FIG. 15B given that received parameter information. For example, values could be generated for a number of groups and the group sizes that will accommodate their run size, in addition to the number of factors. Values for the number of groups, a group size or number of factors are displayed in graphical user interface 1550.

Figure 16:
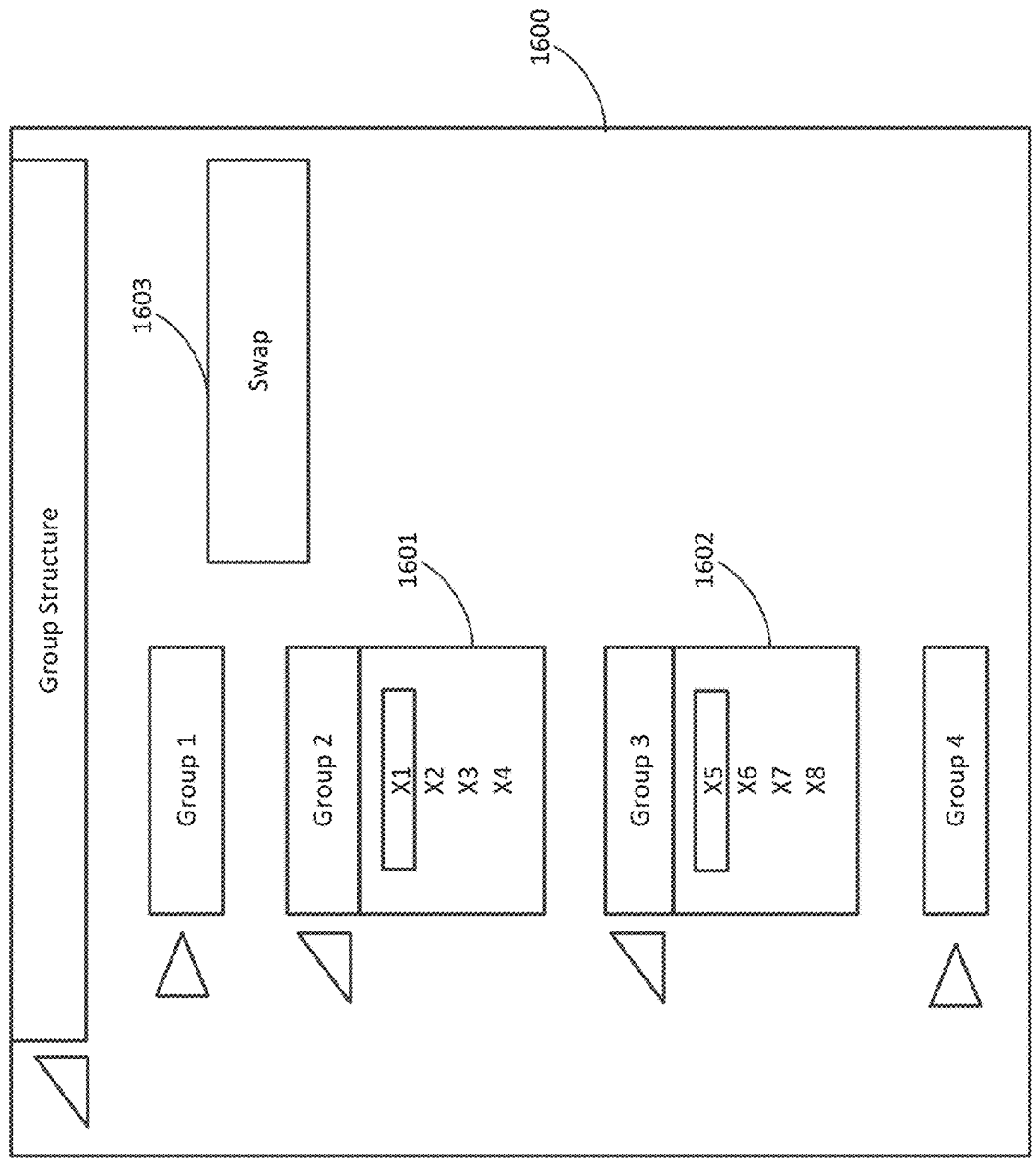
FIG. 16 illustrates a graphical user interface for customizing factor groups for a supersaturated design in at least one embodiment of the present technology.

FIG. 16 illustrates a graphical user interface 1600 for customizing factor groups for a supersaturated design. In the example shown, four groups are displayed in graphical user interface 1600. In other embodiments, more or less groups are possible. There is an indication of an assignment of the different factors to one of the different groups provided. For example, as shown in the drop-down menu 1601, factors X1, X2, X3, and X4 are assigned to group 2. As shown in the drop-down menu 1602, factors X5, X6, X7, and X8 are assigned to group 3.

In one or more embodiments, a computing device (e.g., computing device 1302) determines an optimal assignment of factors. For example, the computing device may assign factors to different groups for the different factors according to a first design. The computing device computes one or more measures of orthogonality between the different groups according to the first design. For example, a dot product is taken between options for the factors of one group and options for factors of another group. The computing device assigns factors to different groups for the different factors according to a second design, different from the first design, and computes one or more measures of orthogonality between the different groups according to the second design. The computing device selects a selected one of the first design or the second design based on comparing the one or more measures of orthogonality between the different groups according to the first design to the one or more measures of orthogonality between the different groups according to the second design. The computing device can then generate the supersaturated design for the design of the experiment according to the selected one of the first design or the second design.

However, the factors are assigned, in one or more embodiments, a user can update these assignments. For example, a user may believe that different factors may be important to observe. The user may want to separate these important factors into different groups. As shown in FIG. 16, factor X2 is selected and factor X5 is selected. The computing device can receive user input indicating an updated assignment of the different factors to one of the different groups by switching a factor of the different factors from its assigned group of the different groups with a factor in another group of the different groups (e.g., by selecting the swap button 1603). In this case, once the user has completed his choices, the supersaturated design can be based on the updated assignment, received values and/or generated values as described herein.

FIG. 17 illustrates a portion of a generated supersaturated design 1700. As shown in FIG. 17, the generation of a design may include multiple different types of factors. The design shown here is generated with factors including an intercept of a model for the experiment shown in column 1701. Additionally, or alternatively, one or more reserved factors may be generated as part of the supersaturated design 1700 as shown in columns 1702. The reserved factors are test factors used in generating the design of the experiment but are not factors for conducting the experiment. They can also be referred to as pseudo-factors or fake-factors. Generating these factors can be used in analysis of the design (e.g., to provide a lack-of-fit estimate or unbiased estimates of error variance). Additionally, or alternatively, multiple experiment factors are present in columns 1703. These are factors present in conducting an experiment.

In one or more embodiments, a computing device (e.g., computing device 1302) assigns design options to each of the reserved factors. The computing device generates, based on the reserved factors with assigned design options, received values/and or generated values, the supersaturated design for the design of the experiment.

The options in this example are assigned by the computing device for each of the different types of factors and the options are represented as "1" and "−1". If the factor is a categorical factor, a "1" is assigned to represent one option and a "−1" is assigned to represent the other. Where the factor is continuous, a 1 can be assigned to represent a high value in the continuous range and the −1 can be assigned to represent a low value in the continuous range. Different values or selection for options can be made. In other examples, a user can assign the option types or change an assigned option type. For example, a user may have a belief as to the direction of an effect (i.e. a positive or negative slope) and a 1 can be assigned to a level expected to increase the response of a model. This may improve the ability of the design to detect active effects.

Figure 18:
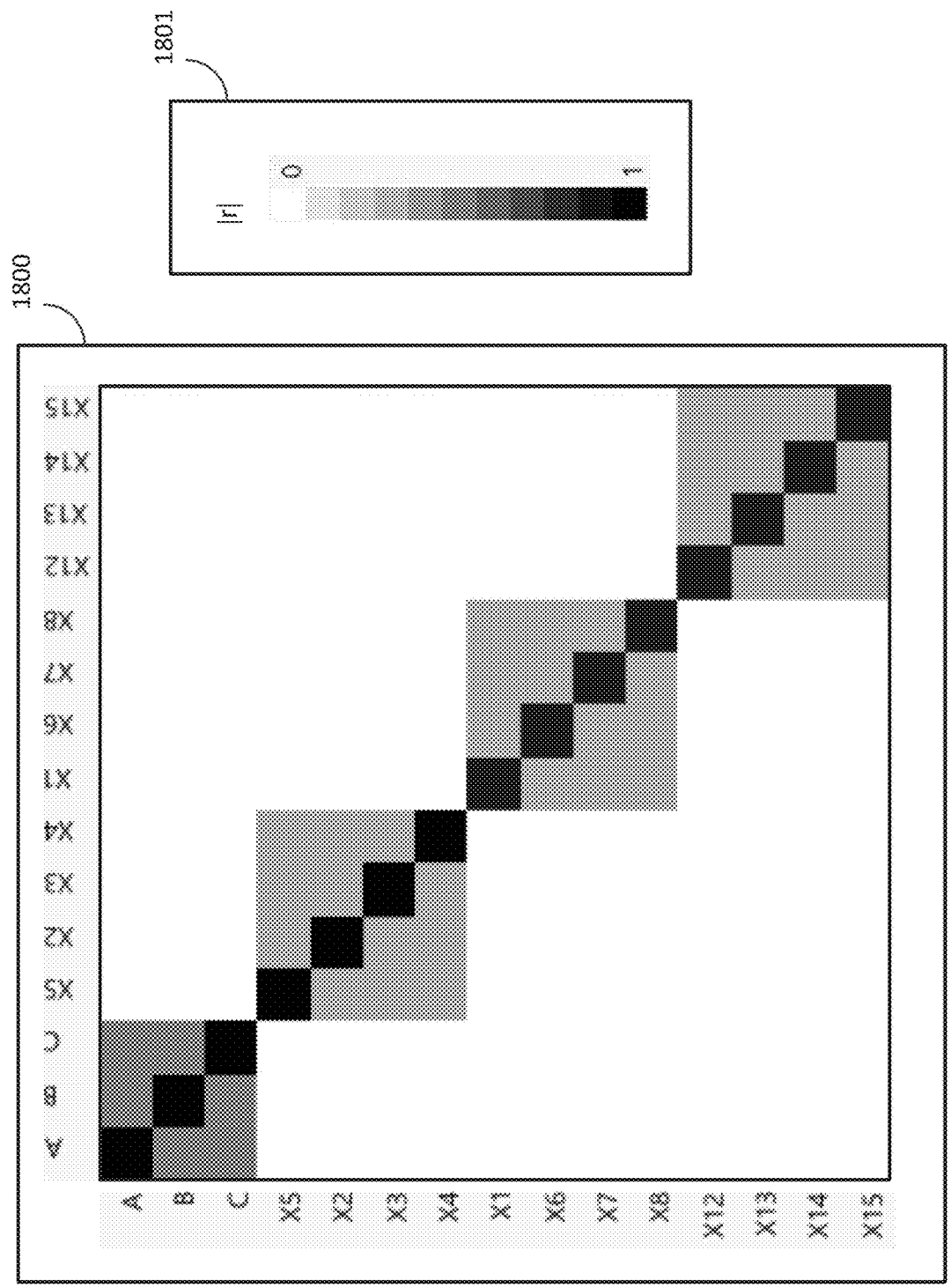
FIG. 18 illustrates an indication of orthogonality between groups of factors of a generated supersaturated design in at least one embodiment of the present technology.

FIG. 18 illustrates an indication of orthogonality between factors of a generated supersaturated design in a graph 1800. The key 1801 shows a color gradient for indicating measures of orthogonality. In the example, X1 and X5 have been swapped from their groups of FIG. 17. As shown, this swapped design has achieved factors in different groups that are orthogonal to one another represented in the graph 1800 as white for an |r|=0. For example, factors A, B, and C are in one group and show as white at intercepts with X1-X15. Factors are not orthogonal with factors in the same group and show in graph 1800 as gray or black for a nonzero |r|. When a factor intercepts with itself it is represented as black in the graph 1800 because it has an |r|=1. In one or more embodiments, the indication of the supersaturated design may be a graph such as graph 1800 showing the orthogonal relationship between factors of the supersaturated design. The same or different colors could be used to show a measure of orthogonality. This graph 1800 can then serve as an indication that the design is group-orthogonal.

FIG. 19 illustrates an indication of correlation between a portion of factors of a generated supersaturated design. A portion of a correlation matrix 1900 is shown. Factors with correlations to one another (i.e. with a non-zero correlation score) can be isolated to within a single group, in one or more embodiments, such that the factors are not correlated to factors of other groups. The non-zero correlation scores are shown bolded in FIG. 19. Ideally, the scores will be less than 1 and as close to zero as possible. Scores of 1 would mean that the factors are correlated to a degree that one cannot tell the difference between the effects of the factors.

FIG. 20 illustrates a graphical user interface 2000 for customizing factors for a supersaturated design. In one or more embodiments, it may be helpful either in viewing the design or in analyzing the design to assign labels or properties to various factors. Assigning a label or property could comprise changing a default label or property. For example, a computing device (e.g., computing device 1302) may receive user input selecting respective customization for a respective factor. For instance, a computing device could receive user input indicating whether the respective factor of the different factors is continuous or discrete. FIG. 20 shows assigning label factors including experiment-specific factor names 2010 and a factor role 2012 (e.g., continuous, discrete numeric, discrete categorical, etc.) in a stress-test experiment. Additionally, or alternatively, a computing device could receive user input indicating a respective range for the respective factor of the different factors. For example, as shown in FIG. 20, a lower bound 2014 and an upper bound 2016 is assigned for each of the factors. In some cases (e.g., where the factor is categorical), the lower and upper band simply represent different options within the category. In one or more embodiments, a computing device generates a corresponding set of two options for the respective factor (e.g., by assigning a "−1" to lower bound 2014 and a "1" to upper bound 2016). The set represents the respective customization for the respective factor (e.g., the computing device maintains a mapping between the user provided bounds and the generated bounds).

Figure 21:
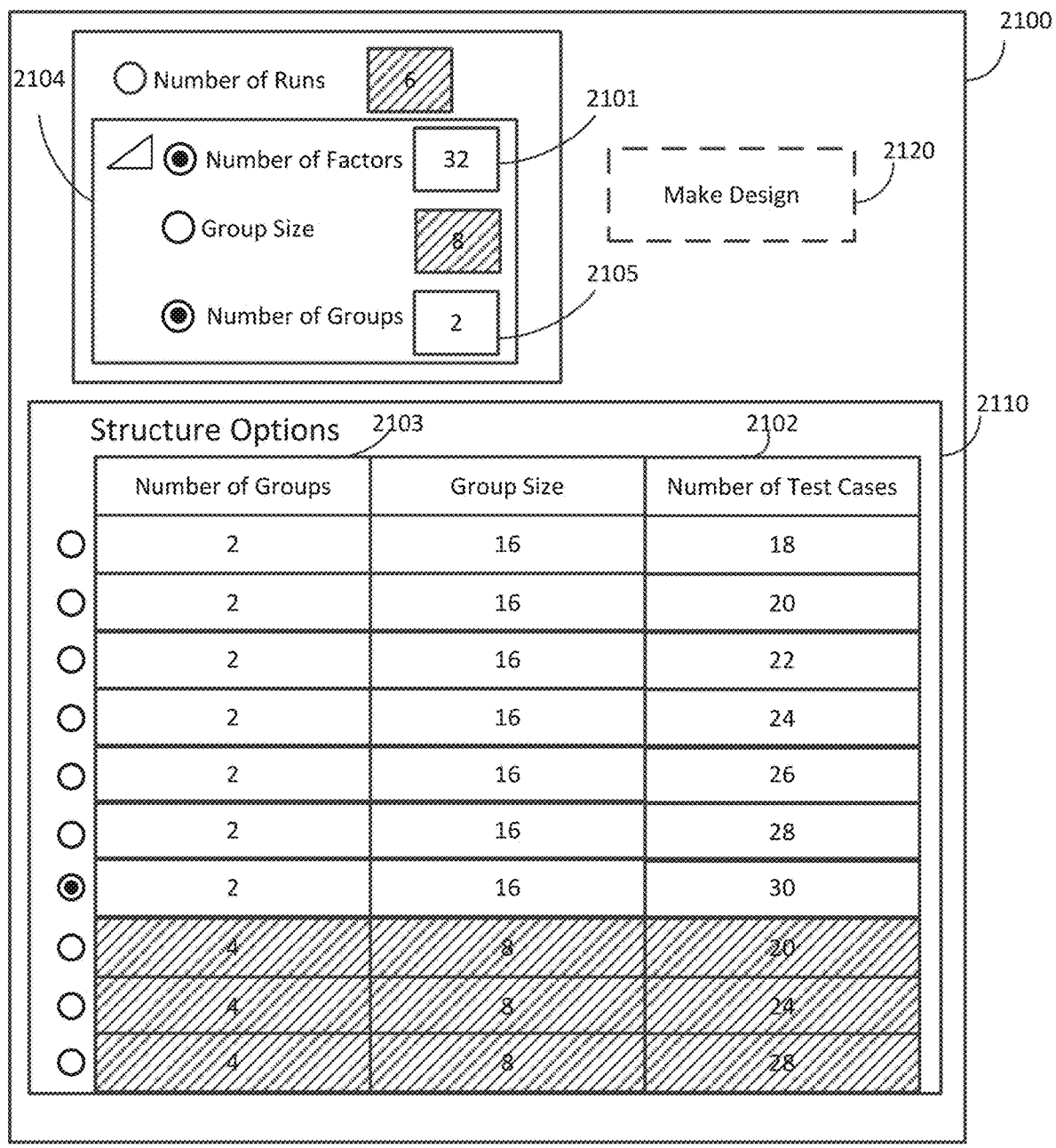
FIG. 21 illustrates a graphical user interface for generating a supersaturated design in at least one embodiment of the present technology.

FIG. 21 illustrates a graphical user interface 2100 for generating a supersaturated design in an example embodiment. In this example, a computing device (e.g., computing device 1302) receives a value for a parameter indicating a total number of different factors for the design of the experiment by entering a value in the text box 2101. The computing device generates a respective value for each of multiple other parameters by generating multiple options for a parameter. For example, different options are shown in column 2102 for the total number of test cases for the design of the experiment. Different options are shown in column 2103 for the total number of different groups for the different factors. Note that graphical user interface 2100 displays design options showing allowable test cases or run sizes rather than factors as in graphical user interface 1550, since the number of factors has been set.

In one or more embodiments, a computing device displays in a graphical user interface (e.g., graphical user interface 2100) a recommended value for a parameter of the multiple parameters based on one or more user goals for the supersaturated design. For example, the options displayed via the graphical user interface 2100 in a structure options box 2210 provide design parameters that would create a group-orthogonal supersaturated design with 32 factors. In one or more embodiments, the computing device receives, from a user of the graphical user interface, a selection of a selected one of the multiple options or a recommended value; and generates the supersaturated design based on the received value and the selected one of the multiple options.

In one or more embodiments, the user may provide values for multiple parameters. For example, as shown in the drop-down box 2104, the user has restricted the factors to two groups by entering a "2" into the text box 2105.

This can restrict the number of suggested structure options in a structure options box 2110 (e.g., by graying out options that would not reflect the user's goals for the design or by not displaying those designs at all).

In this example, the user has explicitly indicated a value for the number of factors and the number of groups. However, in other embodiments a value for a parameter could be implicitly indicated. For example, the group size is implicitly indicated here based on the restrictions placed on the number of factors and number of groups. In other examples, other values could be indicated implicitly or explicitly. For example, the total number of the different groups of the different factors could be implicitly indicated by indicating the number of factors and the total number of factors in a group for the design of the experiment (or group size).

As in other embodiments, a user can generate a design by selecting the make a design button 2120. Additionally, or alternatively, the user sets features about the design as in other embodiments (e.g., the user can now change the design role from continuous to categorical, change the factor names, and change the factor levels).

FIG. 22A illustrates a flow diagram for generating a supersaturated design.

In an operation 2201 the method 2200 comprises receiving and/or determining what kind of user specific information is received (e.g., a number of runs or factors). If the user provided values for factors, in an operation 2202 the method 2200 comprises determining design information (e.g., number of groups and/or number of runs). If the user provided for values for runs, in an operation 2203 the method 2200 comprises determining design information (e.g., number of groups and/or number of factors).

In an operation 2204 the method 2200 comprises user customization (e.g., user customization shown in FIG. 16 and FIG. 20).

In an operation 2205 the method 2200 comprises generating a design.

In one example of generating a design, let H be a Hadamard matrix of order m, m=0(mod4). Let T be a matrix with more rows w then columns q, and let $$X = H \otimes T \quad (1)$$

where "$\otimes$" is the standard Kronecker product so that X is an mw×mq matrix.

For example, T could be related to an optimal design (e.g., a transpose of a D-optimal design for q runs and w columns) or T could be related to a covering array. In one example let T correspond to the first w rows of a Hadamard matrix of order q. Assuming the first column of both H and T is an n×1 vector of ones which has first column comprised of all 1's. This will be the design (or model) matrix of a main-effects design for the p=mq−1 two-level factors having number of observations n=mw. The first column represents the intercept, while the other columns give the levels of the factors. For convenience of notation, an intercept is a "factor" with one level only, and the factors are labelled according to the columns of X.

Define m groups of factor indeces:

$$g_j = \{(j-1)q+1, \ldots, qj\}, j=1, \ldots, m.$$

where q is the number of columns in T, and let $G_j, j=1 \ldots, m$ denote the submatrix of X comprised of the columns in the jth group. With this setup, it is easy to see that any factor from group $g_j$ is uncorrelated with any factor from another group $g_{j'}$, for $j \neq j'$. To see this, observe that $$X'X = H'H \otimes T'T = mI_m \otimes T'T$$

Thus X'X is a block diagonal matrix, which means that columns corresponding to distinct groups are orthogonal. In particular, X'X has block-diagonal structure comprised of m q×q blocks as follows:

$$X'X = \begin{pmatrix} mT'T & O & \ldots & O \\ O & mT'T & \ldots & O \\ \ldots & \ldots & \ldots & \ldots \\ O & O & \ldots & mT'T \end{pmatrix}$$

where 0 denotes matrix of all zeros. In addition, all of the matrices $G_j$, for $j>1$, are balanced. A design constructed using equation (1) is a group-orthogonal supersaturated designs (GO-SSDs).

As an example, assume that based on received values and generated values, a supersaturated design was constructed for 12 test cases and 16 columns (comprising factors, intercept and pseduo-factors). Let H be a 4×4 Hadamard matrix so that m=w=4 and let T be any 4×4 Hadamard matrix with a row removed, so that q=3. The number of rows is mq=12 and the number of columns is mw=16 as required, where:

$$H = \begin{pmatrix} 1 & 1 & 1 & 1 \\ 1 & -1 & 1 & -1 \\ 1 & 1 & -1 & -1 \\ 1 & -1 & -1 & 1 \end{pmatrix} \text{ and } T = \begin{pmatrix} 1 & 1 & 1 & 1 \\ 1 & -1 & 1 & -1 \\ 1 & 1 & -1 & -1 \end{pmatrix}$$

The resulting design 2250 D=H⊗T is shown in FIG. 22B. $P_1$, $P_2$ and $P_3$ denote the three pseudo-factor columns 2251 in the first group, which is used for obtaining an estimate of the error variance. The real experimental factors are denoted in columns 2252. The columns 2251 are not balanced in that there are not the same amount of "1" options as "−1" options in a given factor column. However, all columns corresponding to the real factors in Groups 2 through 4 for columns 2252 are balanced in that there are the same amount of "1" options as "−1" options.

Figure 22C:
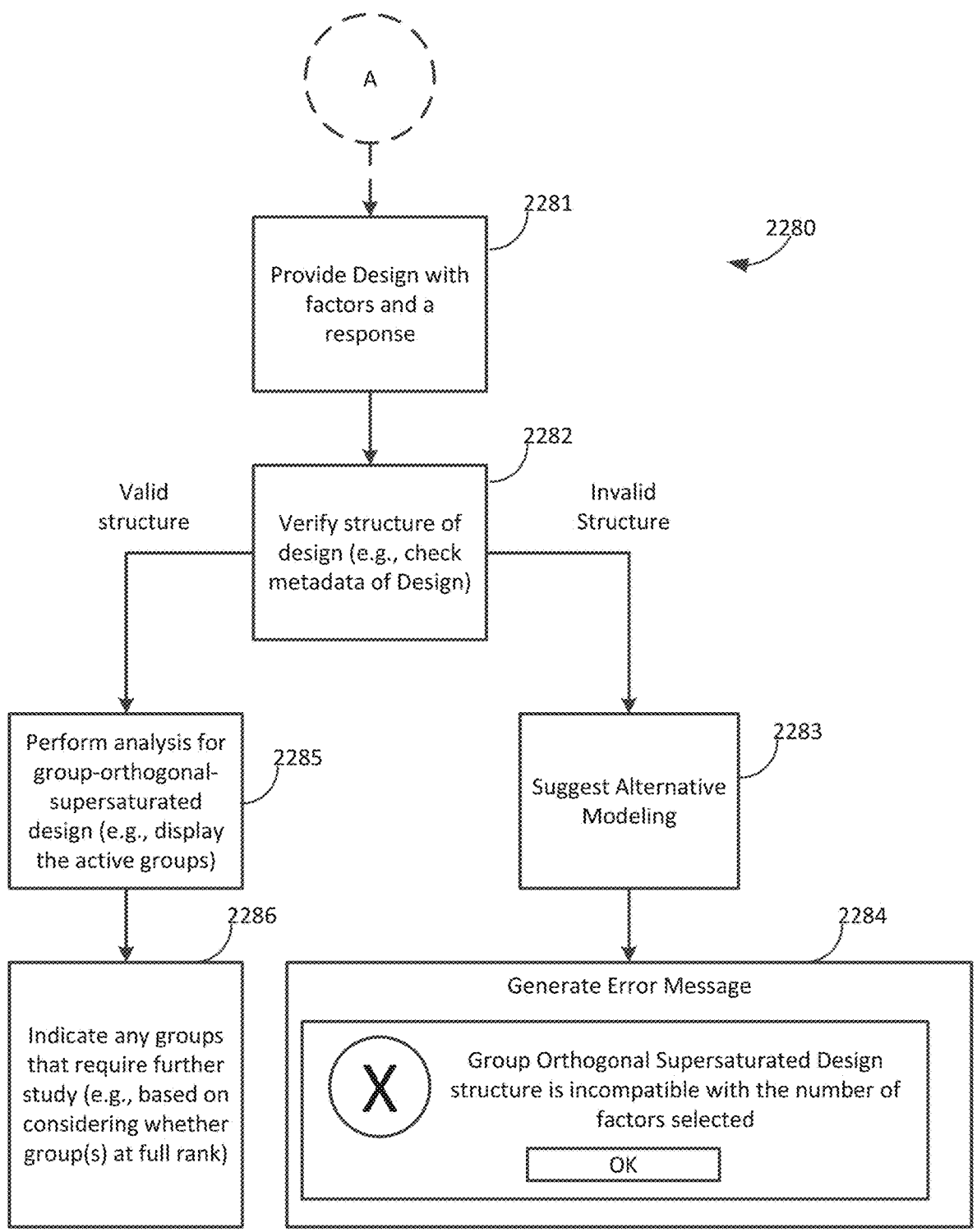
FIG. 22C illustrates a flow diagram for analyzing a supersaturated design in at least one embodiment of the present technology.

In addition to creating the GO-SSDs, one or more embodiments include analyzing output of an experiment taking advantage of the generated design structure. FIG. 22C illustrates a flow diagram of the method 2280 for analyzing a supersaturated design. It may follow the method 2200 or be separate from FIG. 22A. The method 2280 can be implemented using a computing device (e.g., computing device 1302).

The method 2280 comprises an operation 2281 of providing a design with factors and a response. For example, the design may be a supersaturated design generated using method 2200. The response may come from implementing the experiment according to the design. Alternatively, the design may not even be a supersaturated design at all.

In analyzing the output, one issue is how to handle validating that the design has a group-orthogonal structure. Method 2280 comprises an operation 2282 to verify the structure of the design. For example, a computing device can validate whether the supersaturated design has a group-orthogonal structure. The computing device can selectively, based on whether the supersaturated design has a group-orthogonal structure, generate an analysis of the supersaturated design; and output, to an output device, the indication of the supersaturated design by indicating the analysis of the supersaturated design.

In one or more embodiments, a computing device studies the structure of a design and checks if the structure is group orthogonal by, for instance, partitioning inputs based on their orthogonality to the other factors. Alternatively, or additionally, if the design was created in JMP®, metadata is stored reflecting the number of runs, factors, groups, and group sizes. This metadata can be checked to confirm the structure of the design.

In one or more embodiments, if the structure is not group-orthogonal (i.e. has an invalid structure), an operation 2284 could be used to generate an error message. Additionally, or alternatively, an operation 2283 can be used to suggest alternative modeling. For example, a generalized regression platform (or stepwise regression) could be pre-populated with the main effects model since the GO-SSD analysis cannot be done. The order of operations 2283 and 2284 is merely an example. Operations 2283 and operations 2284 can be performed in any order or performed simultaneously.

In the same or different embodiments, if the structure is group-orthogonal (i.e. has a valid structure), an operation 2285 can be used to perform analysis for a group-orthogonal supersaturated design. As one example, the analysis of the design comprises identifying active factors. An active factor could be indicated as a factor that significantly contributes to an outcome of the experiment. The active groups comprising these active factors could be displayed as part of operation 2285. In one or more embodiments, the operation 2286 could indicate groups that require further study. For example, it could indicate further consideration of whether the groups are at full rank. For instance, if the number of active factors exceeds the rank of a Hadamard matrix used to generate the design, this could indicate that it is difficult to identify the active factors in those groups.

In one or more embodiments, the indication of the supersaturated design comprises an indication of a contribution of the active factor to an outcome of the experiment or other information related to an active factor (e.g., to display active groups).

Figure 23:
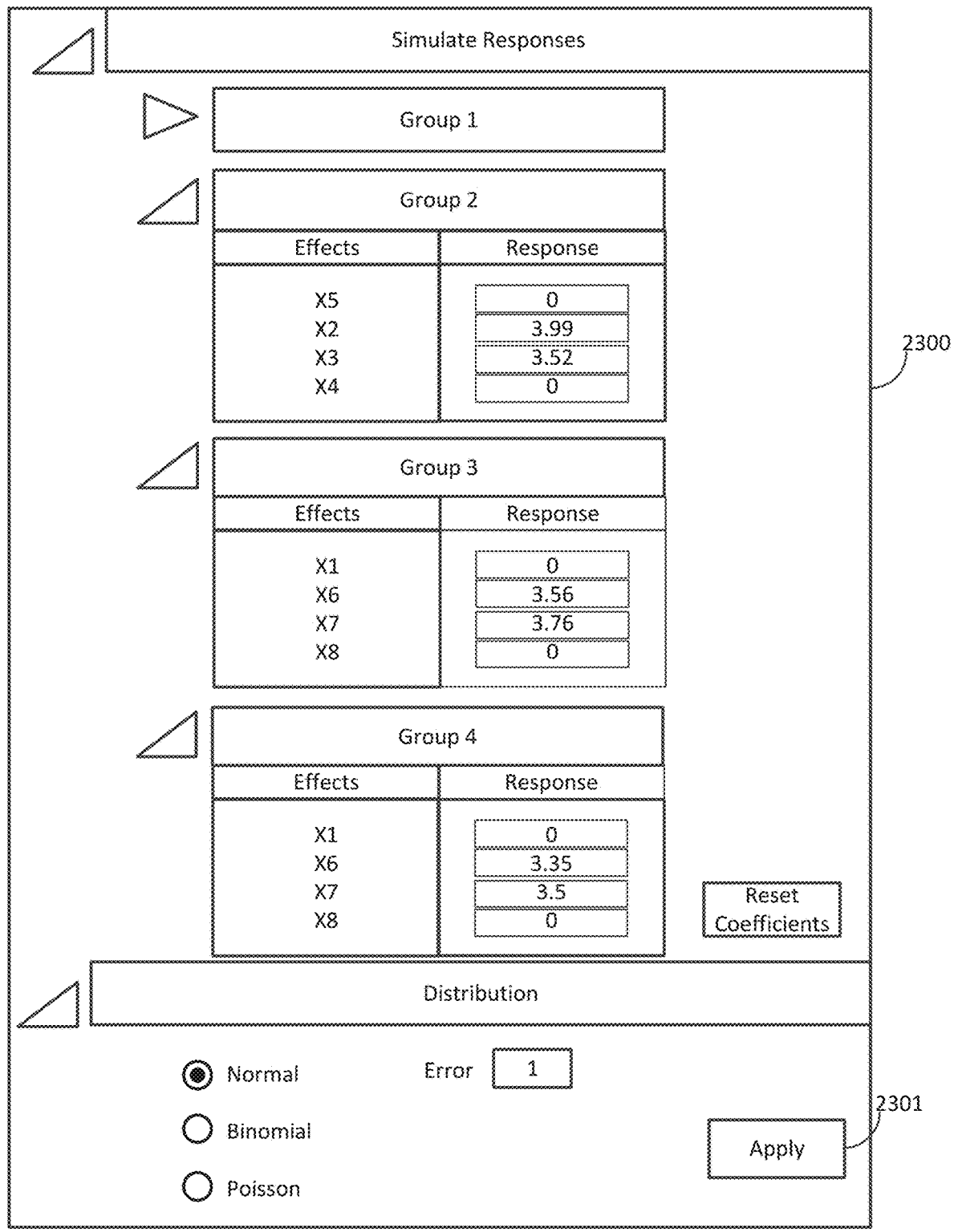
FIG. 23 illustrates a graphical user interface for simulating responses according to a supersaturated design in at least one embodiment of the present technology.

In one or more embodiments, a computing device (e.g., a computing device 1302) generates a model for determining predicted responses of a computer-simulation of the experiment according to the supersaturated design for the design of the experiment. FIG. 23 illustrates a graphical user interface 2300 for simulating responses according to a supersaturated design. A JMP data table can also be created from the generated design, with responses according to the generated design recorded and analysis completed.

In the example shown in FIG. 23, responses for each of the factors or effects are shown. The model according to these responses would be:

$$y=3.99X2+3.52X3+3.56X6+3.76X7+3.35X6+3.5X7$$

The model may not need to consider all the factors, or the response assigned may be 0. Other features of the model can be selected, such as normal, binomial or poisson distributions and a value for error in the model. In this case a normal distribution is selected. In one or more embodiments, a computing device generates an error variance (e.g., one that is independent of the model). In this case an error variance (a) of 1 is selected in graphical user interface 2300. The computing device can generate a simulated set of responses for each of the test cases according to the model, the error variance, and the supersaturated design. The computing device can output, to the output device, an indication of the supersaturated design by outputting the simulated set of responses (e.g., by selecting an apply button 2301).

FIGS. 24A-24B illustrate example graphical user interfaces for an analysis of a supersaturated design. If the structure is valid, an important consideration for displaying the analysis of GO-SSDs is that in addition to the typical concept of identifying important factors, a practitioner will often want to know which groups did and did not have active factors. In one or more embodiments, in indication of the supersaturated design comprises an indication of a contribution of an active factor to an outcome of an experiment according to the supersaturated design. An analysis tool can first display the results per group, where inactive groups (i.e. those with no active factors) are greyed out. FIG. 24A shows a graphical user interface 2400 with Groups 1 and 3 grayed out in a 12-run design with 4 groups of 4 factors. Group 2 has 2 active factors (X5 and X6), and Group 4 has one active factor. Information regarding these factors is also displayed. An estimate of an effect of the group is shown for each active factor (e.g., an estimate change in outcome or change in a model slope). The higher the estimate shown the larger the effect of that factor. In this example factor X6 has the largest effect.

One or more embodiments show a standard error or variance of the factor. A t ratio is also shown, which is the estimate divided by the standard error. An absolute value of the t ratio is used to determine a probability of the significance of the factor.

Graphical user interface 2450 is another example of an indication of a contribution of an active factor to an outcome of an experiment according to the supersaturated design.

In this example, the active factors are combined into a combined model parameter estimates 2451.

Other information about a model according to a supersaturated design can be given. For example, a degree of freedom (DF) 2453 for the error can be computed. A degree of freedom indicates the number of independently variable factors effecting an outcome. This is a measure of the freedom in the model (e.g. what extra information or assumptions about the relationship between factors may be limiting the model). A higher value means there should be more confidence in the model because there is a greater independence of factors. It can also be used as a test (F-test) or indicator of active factors. A root mean square estimate (RMSE) 2452 can be computed. The RMSE is a measure of the difference between values predicted by the model and values observed. A user can use this information in deciding to make a model 2454 or run a model 2455.

Accordingly, embodiments herein present techniques useful for generating a design for an experiment (e.g., a supersaturated design) and analyzing a model of the experiment according to the design.

What is claimed is:

1. A computer-program product tangibly embodied in a non-transitory machine-readable storage medium, the computer-program product including instructions operable to cause a computing device to:
receive a request for a design of an experiment, wherein the design of the experiment comprises a plurality of test cases, each test case of the plurality of test cases comprises multiple test conditions for testing one of different factors for the experiment, and wherein a test condition of the multiple test conditions comprises one of different options for a given factor in the design of the experiment;
receive a first value for a first parameter of multiple parameters for the design of the experiment, wherein the multiple parameters indicate a total number of the plurality of test cases for the design of the experiment, a total number of the different factors for the design of the experiment and a total number of different groups for grouping factors of the different factors;
generate a respective value for each of one or more other parameters of the multiple parameters such that the design of the experiment according to the multiple parameters is a supersaturated design where the total number of the different factors is greater than the total number of the plurality of test cases, wherein the one or more other parameters of the multiple parameters are different than the first parameter;
generate the supersaturated design for the design of the experiment that is a design that distributes each of the different factors into one of the different groups, wherein generation of the supersaturated design for the design of the experiment is based on the first value for the first parameter and the respective value for each of the one or more other parameters, and the generation of the supersaturated design for the design of the experiment comprises:
assigning factors to the different groups for the different factors according to a first design;
computing one or more measures of orthogonality between the different groups according to the first design;
assigning factors to the different groups for the different factors according to a second design, different from the first design;
computing one or more measures of orthogonality between the different groups according to the second design;
selecting a selected one of the first design or the second design based on comparing the one or more measures of orthogonality between the different groups according to the first design to the one or more measures of orthogonality between the different groups according to the second design; and generating the supersaturated design for the design of the experiment according to the selected one of the first design or the second design; and output, to an output device, an indication of the supersaturated design.

2. The computer-program product of claim 1, wherein the first parameter indicates the total number of the different factors for the design of the experiment; and wherein the instructions are operable to cause a computing device to:

receive the first value for the first parameter by receiving input indicating the total number of the different factors for the design of the experiment;

generate the respective value for each of the one or more parameters of the multiple parameters by generating multiple options indicating different possible values for each of the one or more other parameters of the multiple parameters, the one or more other parameters of the multiple parameters indicating the total number of the plurality of test cases for the design of the experiment and the total number of the different groups for the different factors;

display, via a graphical user interface, the multiple options;

receive, from a user of the graphical user interface, a selection of a selected one of the multiple options; and generate the supersaturated design based on the first value for the first parameter and the selected one of the multiple options.

3. The computer-program product of claim 1, wherein the first parameter indicates the total number of the plurality of test cases for the design of the experiment; and wherein the instructions are operable to cause the computing device to:

receive the first value for the first parameter by receiving input indicating the total number of the plurality of test cases for the design of the experiment;

generate the respective value for each of the one or more other parameters of the multiple parameters by generating multiple options indicating different possible values for each of the one or more other parameters of the multiple parameters, the one or more other parameters indicating the total number of the different factors for the design of the experiment and the total number of the different groups for the different factors;

display, via a graphical user interface, the multiple options;

receive, from a user of the graphical user interface, a selection of a selected one of the multiple options; and generate the supersaturated design based on the first value for the first parameter and the selected one of the multiple options.

4. The computer-program product of claim 1, wherein the instructions are operable to cause the computing device to:

receive user input selecting respective customization for a respective factor of the different factors, wherein the respective customization comprises one or more of:

user input indicating whether the respective factor of the different factors is continuous or discrete; and user input indicating a respective range for the respective factor of the different factors; and generate a corresponding set of two options for the respective factor, wherein the set represents the respective customization for the respective factor.

5. The computer-program product of claim 1, wherein the instructions are operable to cause the computing device to generate the supersaturated design for the design of the experiment by:

selecting a respective order for each of one or more Hadamard matrices based on the first value for the first parameter and the respective value for each of the one or more other parameters of the multiple parameters; and computing, based on the respective order, the one or more Hadamard matrices.

6. The computer-program product of claim 1, wherein the different factors comprise an intercept of a model for the experiment, multiple experiment factors present in conducting the experiment, and multiple reserved factors not present in conducting the experiment.

7. The computer-program product of claim 1, wherein each of the different groups comprise a same number of factors, and the total number of the different groups is a power of 2.

8. The computer-program product of claim 1, wherein the instructions are operable to cause the computing device to:

display in a graphical user interface a recommended value for a parameter of the multiple parameters based on one or more user goals for the supersaturated design; and generate, the supersaturated design, responsive to a user selection of the recommended value.

9. The computer-program product of claim 1, wherein the multiple parameters indicate the total number of the different groups of the different factors explicitly by indicating a total number of groups of the different factors or implicitly by indicating a total number of factors in a group for the design of the experiment;

wherein the instructions are operable to cause the computing device to:

display, via a graphical user interface, multiple options indicating different possible values for the total number of groups of the different factors or the total number of factors in a group for the design of the experiment;

receive a selection of one of the multiple options; and generate the supersaturated design based on the first value for the first parameter and the selected one of the multiple options.

10. The computer-program product of claim 1, wherein the instructions are operable to cause the computing device to generate the supersaturated design by:

displaying, in a graphical user interface, four or more different groups for the different factors, and an indication of an assignment of the different factors to one of the different groups;

receiving user input indicating an updated assignment of the different factors to one of the different groups by switching a factor of the different factors from its assigned group of the different groups with a factor in another group of the different groups; and generate the supersaturated design based on the updated assignment, the first value for the first parameter, and the respective value for each of the one or more other parameters of the multiple parameters.

11. The computer-program product of claim 1, wherein the instructions are operable to cause the computing device to generate the supersaturated design by:
generating reserved factors for the design of the experiment, wherein the reserved factors are test factors used in generating the design of the experiment but are not factors for conducting the experiment;
assigning design options to each of the reserved factors; and
generating, based on the reserved factors with assigned design options, the first value for the first parameter, and the respective value for each of the one or more other parameters of the multiple parameters, the supersaturated design for the design of the experiment.

12. The computer-program product of claim 1, wherein the instructions are operable to cause the computing device to:
generate a model for determining predicted responses of a computer-simulation of the experiment according to the supersaturated design for the design of the experiment;
generate an error variance that is independent of the model;
generate a simulated set of responses for each of the test cases according to the model, the error variance, and the supersaturated design; and
output, to the output device, the indication of the supersaturated design by outputting the simulated set of responses.

13. The computer-program product of claim 1, wherein the instructions are operable to cause the computing device to:
validate whether the supersaturated design has a group-orthogonal structure;
selectively, based on whether the supersaturated design has a group-orthogonal structure, generate an analysis of the supersaturated design; and
output, to the output device, the indication of the supersaturated design by indicating the analysis of the supersaturated design.

14. The computer-program product of claim 1,
wherein the indication of the different factors comprises an active factor that contributes to an outcome of the experiment; and
wherein the indication of the supersaturated design comprises an indication of a contribution of the active factor to the outcome of the experiment.

15. The computer-program product of claim 1, wherein the indication of the supersaturated design comprises a generated test condition for each element of a test case of the design of the experiment.

16. The computer-program product of claim 1, wherein the indication of the supersaturated design comprises correlation information between factors according to the supersaturated design.

17. A computer-implemented method comprising:
receiving a request for a design of an experiment, wherein the design of the experiment comprises a plurality of test cases, each test case of the plurality of test cases comprises multiple test conditions for testing one of different factors for the experiment, and wherein a test condition of the multiple test conditions comprises one of different options for a given factor in the design of the experiment;
receiving a first value for a first parameter of multiple parameters for the design of the experiment, wherein the multiple parameters indicate a total number of the plurality of test cases for the design of the experiment, a total number of the different factors for the design of the experiment and a total number of different groups for grouping factors of the different factors;
generating a respective value for each of one or more other parameters of the multiple parameters such that the design of the experiment according to the multiple parameters is a supersaturated design where the total number of the different factors is greater than the total number of the plurality of test cases, wherein the one or more other parameters of the multiple parameters are different than the first parameter;
generating, based on the first value for the first parameter and the respective value for each of the one or more other parameters, the supersaturated design for the design of the experiment that is a design that distributes each of the different factors into one of the different groups, wherein the generating comprises:
assigning factors to the different groups for the different factors according to a first design;
computing one or more measures of orthogonality between the different groups according to the first design;
assigning factors to the different groups for the different factors according to a second design, different from the first design;
computing one or more measures of orthogonality between the different groups according to the second design;
selecting a selected one of the first design or the second design based on comparing the one or more measures of orthogonality between the different groups according to the first design to the one or more measures of orthogonality between the different groups according to the second design; and
generating the supersaturated design for the design of the experiment according to the selected one of the first design or the second design; and
outputting, to an output device, an indication of the supersaturated design.

18. The computer-implemented method of claim 17,
wherein the first parameter indicates the total number of the different factors for the design of the experiment;
wherein the receiving the first value for the first parameter comprises receiving input indicating the total number of the different factors for the design of the experiment;
wherein the generating the respective value comprises generating multiple options indicating different possible values for each of the one or more other parameters of the multiple parameters, the one or more other parameters of the multiple parameters indicating the total number of the plurality of test cases for the design of the experiment and the total number of the different groups for the different factors;
wherein the computer-implemented method further comprises:
displaying, via a graphical user interface, the multiple options; and
receiving, from a user of the graphical user interface, a selection of a selected one of the multiple options; and
wherein the generating the supersaturated design comprises generating the supersaturated design based on the first value for the first parameter and the selected one of the multiple options.

19. The computer-implemented method of claim 17,
wherein the first parameter indicates the total number of the plurality of test cases for the design of the experiment;
wherein the receiving the first value for the first parameter comprises receiving the first value for the first parameter by receiving input indicating the total number of the plurality of test cases for the design of the experiment;
wherein the generating the respective value comprises generating multiple options indicating different possible values for each of the one or more other parameters of the multiple parameters, the one or more other parameters indicating the total number of the different factors for the design of the experiment and the total number of the different groups for the different factors
wherein the computer-implemented method further comprises:
  displaying, via a graphical user interface, the multiple options; and
  receiving, from a user of the graphical user interface, a selection of a selected one of the multiple options; and
wherein the generating the supersaturated design comprises generating the supersaturated design based on the first value for the first parameter and the selected one of the multiple options.

20. The computer-implemented method of claim 17, wherein the computer-implemented method further comprises:
receiving user input selecting respective customization for a respective factor of the different factors, wherein the respective customization comprises one or more of:
  user input indicating whether the respective factor of the different factors is continuous or discrete; and
  user input indicating a respective range for the respective factor of the different factors; and
generating a corresponding set of two options for the respective factor, wherein the set represents the respective customization for the respective factor.

21. The computer-implemented method of claim 17, wherein the generating the supersaturated design comprises:
selecting a respective order for each of one or more Hadamard matrices based on the first value for the first parameter and the respective value for each of the one or more other parameters of the multiple parameters; and
  computing, based on the respective order, the one or more Hadamard matrices.

22. The computer-implemented method of claim 17, wherein each of the different groups comprise a same number of factors, and the total number of the different groups is a power of 2.

23. The computer-implemented method of claim 17, wherein the computer-implemented method further comprises:
displaying in a graphical user interface a recommended value for a parameter of the multiple parameters based on one or more user goals for the supersaturated design; and
generating, the supersaturated design, responsive to a user selection of the recommended value.

24. The computer-implemented method of claim 17, wherein the multiple parameters indicate the total number of the different groups of the different factors explicitly by indicating a total number of groups of the different factors or implicitly by indicating a total number of factors in a group for the design of the experiment; and
wherein the computer-implemented method further comprises:
  displaying, via a graphical user interface, multiple options indicating different possible values for the total number of groups of the different factors or the total number of factors in a group for the design of the experiment;
  receiving a selection of one of the multiple options; and
  generating the supersaturated design based on the first value for the first parameter and the selected one of the multiple options.

25. The computer-implemented method of claim 17, wherein the generating the supersaturated design comprises:
  displaying, in a graphical user interface, four or more different groups for the different factors, and an indication of an assignment of the different factors to one of the different groups;
  receiving user input indicating an updated assignment of the different factors to one of the different groups by switching a factor of the different factors from its assigned group of the different groups with a factor in another group of the different groups; and
  generate the supersaturated design based on the updated assignment, the first value for the first parameter, and the respective value for each of one or more other parameters of the multiple parameters.

26. The computer-implemented method of claim 17, wherein the generating the supersaturated design comprises:
  generating reserved factors for the design of the experiment, wherein the reserved factors are test factors used in generating the design of the experiment but are not factors for conducting the experiment;
  assigning design options to each of the reserved factors; and
  generating, based on the reserved factors with assigned design options, the first value for the first parameter, and the respective value for each of one or more other parameters of the multiple parameters, the supersaturated design for the design of the experiment.

27. The computer-implemented method of claim 17,
wherein the generating the supersaturated design comprises:
  validating whether the supersaturated design has a group-orthogonal structure; and
  selectively, based on whether the supersaturated design has a group-orthogonal structure, generate an analysis of the supersaturated design; and
wherein the outputting the indication comprises indicating the analysis of the supersaturated design.

28. The computer-implemented method of claim 17, wherein the different factors comprise an intercept of a model for the experiment, multiple experiment factors present in conducting the experiment, and multiple reserved factors not present in conducting the experiment.

29. The computer-implemented method of claim 17, further comprises:
generating a model for determining predicted responses of a computer-simulation of the experiment according to the supersaturated design for the design of the experiment;
generating an error variance that is independent of the model; and
generating a simulated set of responses for each of the test cases according to the model, the error variance, and the supersaturated design; and wherein the outputting the indication of the supersaturated design comprises outputting the simulated set of responses.

30. A computing device comprising processor and memory, the memory containing instructions executable by the processor wherein the computing device is configured to:
receive a request for a design of an experiment, wherein the design of the experiment comprises a plurality of test cases, each test case of the plurality of test cases comprises multiple test conditions for testing one of different factors for the experiment, and wherein a test condition of the multiple test conditions comprises one of different options for a given factor in the design of the experiment;
receive a first value for a first parameter of multiple parameters for the design of the experiment, wherein the multiple parameters indicate a total number of the plurality of test cases for the design of the experiment, a total number of the different factors for the design of the experiment and a total number of different groups for grouping factors of the different factors;
generate a respective value for each of one or more other parameters of the multiple parameters such that the design of the experiment according to the multiple parameters is a supersaturated design where the total number of the different factors is greater than the total number of the plurality of test cases, wherein the one or more other parameters of the multiple parameters are different than the first parameter;
generate, based on the first value for the first parameter and the respective value for each of the one or more other parameters, the supersaturated design for the design of the experiment that is a design that distributes each of the different factors into one of the different groups, wherein generation of the supersaturated design for the design of the experiment is based on the first value for the first parameter and the respective value for each of the one or more other parameters, and the generation of the supersaturated design for the design of the experiment comprises:
assigning factors to the different groups for the different factors according to a first design;
computing one or more measures of orthogonality between the different groups according to the first design;
assigning factors to the different groups for the different factors according to a second design, different from the first design;
computing one or more measures of orthogonality between the different groups according to the second design;
selecting a selected one of the first design or the second design based on comparing the one or more measures of orthogonality between the different groups according to the first design to the one or more measures of orthogonality between the different groups according to the second design; and
generating the supersaturated design for the design of the experiment according to the selected one of the first design or the second design; and
output, to an output device, an indication of the supersaturated design.

* * * * *